(12) United States Patent
Seo et al.

(10) Patent No.: US 11,848,293 B2
(45) Date of Patent: Dec. 19, 2023

(54) SEMICONDUCTOR PACKAGE

(71) Applicant: Samsung Electronics Co., Ltd., Suwon-si (KR)

(72) Inventors: Sunkyoung Seo, Cheonan-si (KR); Teak Hoon Lee, Hwaseong-si (KR); Chajea Jo, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 250 days.

(21) Appl. No.: 17/376,616

(22) Filed: Jul. 15, 2021

(65) Prior Publication Data
US 2022/0093543 A1 Mar. 24, 2022

(30) Foreign Application Priority Data
Sep. 22, 2020 (KR) .................. 10-2020-0122493

(51) Int. Cl.
*H01L 23/00* (2006.01)
*H01L 25/065* (2023.01)
*H01L 25/10* (2006.01)

(52) U.S. Cl.
CPC ............. *H01L 24/05* (2013.01); *H01L 24/16* (2013.01); *H01L 24/81* (2013.01); *H01L 25/0652* (2013.01); *H01L 25/0657* (2013.01); *H01L 25/105* (2013.01); H01L 2224/05008 (2013.01); H01L 2224/05084 (2013.01); H01L 2224/05111 (2013.01); H01L 2224/05139 (2013.01); H01L 2224/05144 (2013.01); H01L 2224/05155 (2013.01); H01L 2224/16013 (2013.01); H01L 2224/81203 (2013.01);
(Continued)

(58) Field of Classification Search
CPC .......... H01L 24/05; H01L 2924/18161; H01L 25/0657
See application file for complete search history.

(56) References Cited

U.S. PATENT DOCUMENTS 9,159,651 B2 10/2015 Lee et al.
10,083,939 B2 9/2018 Seo et al.
(Continued)

FOREIGN PATENT DOCUMENTS

KR 10-0879191 B1 1/2009
KR 10-2011-0016014 A 2/2011

*Primary Examiner* — Dale E Page
*Assistant Examiner* — Wilner Jean Baptiste
(74) *Attorney, Agent, or Firm* — Harness, Dickey & Pierce, P.L.C.

(57) ABSTRACT

A semiconductor package includes a sequential stack of first and second semiconductor chips, and a first internal connection member that connects the first and second semiconductor chips to each other. The first semiconductor chip includes a first substrate that has a first top surface and a first bottom surface that are opposite to each other, and a first conductive pad on the first top surface. The second semiconductor chip includes a second substrate that has a second top surface and a second bottom surface that are opposite to each other, and a second conductive bump on the second bottom surface. The first internal connection member connects the first conductive pad to the second conductive bump. The first conductive pad has a first width in one direction. The second conductive bump has a second width in the one direction. The first width is smaller than the second width.

19 Claims, 14 Drawing Sheets

(52) U.S. Cl.
CPC ............... *H01L 2225/06513* (2013.01); *H01L 2225/06541* (2013.01); *H01L 2225/06586* (2013.01); *H01L 2225/06589* (2013.01); *H01L 2225/1035* (2013.01); *H01L 2225/1041* (2013.01); *H01L 2225/1058* (2013.01); *H01L 2924/18161* (2013.01)

(56) References Cited

U.S. PATENT DOCUMENTS

| | | |
|---|---|---|
| 10,636,775 B2 | 4/2020 | Chen et al. |
| 10,658,300 B2 | 5/2020 | Kim et al. |
| 10,658,341 B2 | 5/2020 | Seo et al. |
| 2003/0127720 A1* | 7/2003 | Fang .................. H01L 25/0657 257/E25.013 |
| 2017/0338206 A1* | 11/2017 | Seo ................... H01L 23/53238 |

\* cited by examiner

SEMICONDUCTOR PACKAGE

CROSS-REFERENCE TO RELATED APPLICATION

This U.S. nonprovisional application claims priority under 35 U.S.C. § 119 to Korean Patent Application No. 10-2020-0122493 filed on Sep. 22, 2020 in the Korean Intellectual Property Office, the disclosure of which is hereby incorporated by reference in its entirety.

BACKGROUND

The present inventive concepts relate to semiconductor packages.

A semiconductor package is provided to implement an integrated circuit chip to qualify for use in electronic products. A semiconductor package is typically configured such that a semiconductor chip is mounted on a printed circuit board (PCB) and bonding wires or bumps are used to electrically connect the semiconductor chip to the printed circuit board. With the development of electronic industry, many studies have been conducted to improve reliability and durability of semiconductor packages.

SUMMARY

Some example embodiments of the present inventive concepts provide semiconductor packages with increased reliability.

An object of the present inventive concepts is not limited to the mentioned above, and other objects which have not been mentioned above will be clearly understood to those skilled in the art from the following description.

According to some example embodiments of the present inventive concepts, a semiconductor package may comprise: a sequential stack of a first semiconductor chip and a second semiconductor chip; and a first internal connection member that connects the first semiconductor chip to the second semiconductor chip. The first semiconductor chip may include: a first substrate that has a first top surface and a first bottom surface that are opposite to each other; and a first conductive pad on the first top surface. The second semiconductor chip may include: a second substrate that has a second top surface and a second bottom surface that are opposite to each other; and a second conductive bump on the second bottom surface. The first internal connection member may connect the first conductive pad to the second conductive bump. The first conductive pad may have a first width in one direction. The second conductive bump may have a second width in the one direction. The first width may be smaller than the second width.

According to some example embodiments of the present inventive concepts, a semiconductor package may comprise: a sequential stack of a first semiconductor chip and a second semiconductor chip; and a first internal connection member that connects the first semiconductor chip to the second semiconductor chip. The first semiconductor chip may include: a first substrate that has a first top surface and a first bottom surface that are opposite to each other; and a first conductive pad on the first top surface. The second semiconductor chip may include: a second substrate that has a second top surface and a second bottom surface that are opposite to each other; a second conductive pad adjacent to the second bottom surface; and a second conductive bump bonded to the second conductive pad. The first internal connection member may connect the first conductive pad to the second conductive bump. The first internal connection member may include: a first connection region adjacent to the first conductive pad; and a second connection region adjacent to the second conductive bump. Each of the first and second connection regions may include gold (Au). The first connection region has a first average thickness. The second connection region may have a second average thickness smaller than the first average thickness.

According to some example embodiments of the present inventive concepts, a semiconductor package may comprise: a sequential stack of a plurality of semiconductor chips; and a mold layer that covers the semiconductor chips. Each of the semiconductor chips may include: a semiconductor substrate that has a top surface and a bottom surface; an interlayer dielectric layer that covers the bottom surface; a first conductive pad below the interlayer dielectric layer; a conductive bump bonded to the first conductive pad; a through via that penetrates the semiconductor substrate; and a second conductive pad on the top surface and in contact with the through via. The second conductive pad may have a first width in one direction. The conductive bump may have a second width in the one direction. The first width may be smaller than the second width.

According to some example embodiments of the present inventive concepts, a semiconductor package may comprise: a first redistribution substrate; a first semiconductor device mounted through a first internal connection member on the first redistribution substrate; and a first mold layer that covers the first semiconductor device and the first redistribution substrate. The first redistribution substrate may include: a first dielectric layer; an under-bump in the first dielectric layer; a second dielectric layer that covers the first dielectric layer; a first redistribution pattern that includes a first via part and a first line part, the first via part penetrating the second dielectric layer and having a connection with the under-bump, and the first line part protruding onto the second dielectric layer; a third dielectric layer that covers the first redistribution pattern and the second dielectric layer; a second redistribution pattern that includes a second via part and a first pad part, the second via part penetrating the third dielectric layer and having a connection with the first redistribution pattern, and the first pad part protruding onto the third dielectric layer; and a first conductive pad on the second redistribution pattern. The first semiconductor device may include a conductive bump that protrudes outwardly from a bottom surface of the first semiconductor device. The first internal connection member may connect the first conductive pad to the conductive bump. A width of the first conductive pad may be smaller than a width of the conductive bump.

DETAILED DESCRIPTION

Figure 1:
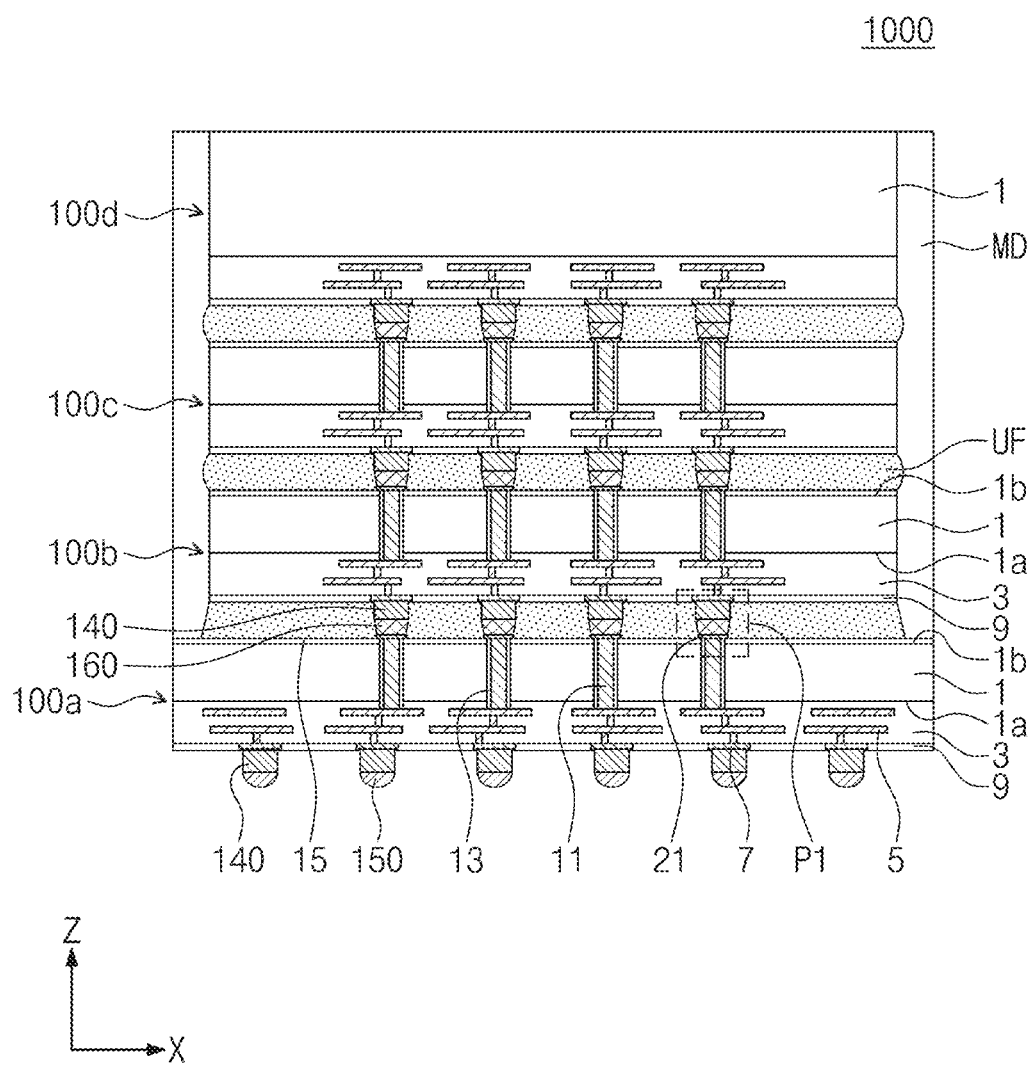
FIG. 1 illustrates a cross-sectional view showing a semiconductor package according to some example embodiments of the present inventive concepts.

Some example embodiments of the present inventive concepts will now be described in detail with reference to the accompanying drawings to aid in clearly explaining the present inventive concepts. It will be understood that the same reference numerals are assigned to the same or similar constituent elements throughout the specification.

In some example embodiments, when a certain part with a layer, film, region, plate, etc. is said to be "on" another part, the part may be "above" or "below" the other part. In some example embodiments, when a certain part with a layer, film, region, plate, etc. is said to be "on" another part, the part may be "indirectly on" or "directly on" the other part. When a certain part is said to be "indirectly on" another part, an interposing structure and/or space may be present between the certain part and the other part such that the certain part and the other part are isolated from direct contact with each other. Conversely, when a certain part is said to be "directly on" another part, it means that there is no other part between the certain part and the other part such that the certain part is in direct contact with the other part.

It will be understood that elements and/or properties thereof (e.g., structures, surfaces, directions, or the like), which may be referred to as being "perpendicular," "parallel," "coplanar," or the like with regard to other elements and/or properties thereof (e.g., structures, surfaces, directions, or the like) may be "perpendicular," "parallel," "coplanar," or the like or may be "substantially perpendicular," "substantially parallel," "substantially coplanar," respectively, with regard to the other elements and/or properties thereof.

Elements and/or properties thereof (e.g., structures, surfaces, directions, or the like) that are "substantially perpendicular" with regard to other elements and/or properties thereof will be understood to be "perpendicular" with regard to the other elements and/or properties thereof within manufacturing tolerances and/or material tolerances and/or have a deviation in magnitude and/or angle from "perpendicular," or the like with regard to the other elements and/or properties thereof that is equal to or less than 10% (e.g., a. tolerance of ±10%).

Elements and/or properties thereof (e.g., structures, surfaces, directions, or the like) that are "substantially parallel" with regard to other elements and/or properties thereof will be understood to be "parallel" with regard to the other elements and/or properties thereof within manufacturing tolerances and/or material tolerances and/or have a deviation in magnitude and/or angle from "parallel," or the like with regard to the other elements and/or properties thereof that is equal to or less than 10% (e.g., a. tolerance of ±10%).

Elements and/or properties thereof (e.g., structures, surfaces, directions, or the like) that are "substantially coplanar" with regard to other elements and/or properties thereof will be understood to be "coplanar" with regard to the other elements and/or properties thereof within manufacturing tolerances and/or material tolerances and/or have a deviation in magnitude and/or angle from "coplanar," or the like with regard to the other elements and/or properties thereof that is equal to or less than 10% (e.g., a. tolerance of ±10%).

It will be understood that elements and/or properties thereof may be recited herein as being "the same" or "equal" as other elements, and it will be further understood that elements and/or properties thereof recited herein as being "the same" as or "equal" to other elements may be "the same" as or "equal" to or "substantially the same" as or "substantially equal" to the other elements and/or properties thereof. Elements and/or properties thereof that are "substantially the same" as or "substantially equal" to other elements and/or properties thereof will be understood to include elements and/or properties thereof that are the same as or equal to the other elements and/or properties thereof within manufacturing tolerances and/or material tolerances. Elements and/or properties thereof that are the same or substantially the same as other elements and/or properties thereof may be structurally the same or substantially the same, functionally the same or substantially the same, and/or compositionally the same or substantially the same.

It will be understood that elements and/or properties thereof described herein as being the "substantially" the same encompasses elements and/or properties thereof that have a relative difference in magnitude that is equal to or less than 10%. Further, regardless of whether elements and/or properties thereof are modified as "substantially," it will be understood that these elements and/or properties thereof should be construed as including a manufacturing or operational tolerance (e.g., ±10%) around the stated elements and/or properties thereof.

When the terms "about" or "substantially" are used in this specification in connection with a numerical value, it is intended that the associated numerical value include a tolerance of ±10% around the stated numerical value. When ranges are specified, the range includes all values therebetween such as increments of 0.1%.

FIG. 1 illustrates a cross-sectional view showing a semiconductor package according to some example embodiments of the present inventive concepts.

Referring to FIG. 1, a semiconductor package 1000 according to some example embodiments may include first, second, third, and fourth semiconductor chips 100a, 100b, 100c, and 100d that are sequentially stacked, and may also include a mold layer MD that covers the first, second, third, and fourth semiconductor chips 100a, 100b, 100c, and 100d. Semiconductor chips that are described herein as being sequentially stacked may be interchangeably referred to as a sequential stack of said semiconductor chips. As shown, the second semiconductor chip 100b may immediately overlie the first semiconductor chip 100a in the second direction Z. The first semiconductor chip 100a may have a width greater (e.g., larger) than those of the second, third, and fourth semiconductor chips 100b, 100c, and 100d. The first semiconductor chip 100a may be of a different type from the second, third, and fourth semiconductor chips 100b, 100c, and 100d. The first semiconductor chip 100a may be, for example, a logic circuit chip. The second, third, and fourth semiconductor chips 100b, 100c, and 100d may be of the same type (e.g., DRAM chip). Some example embodiments discloses a structure where one logic circuit chip and three memory chips are stacked, but the number of the logic circuit chip and the number of the memory chips may be variously changed without being limited thereto. The semiconductor package 1000 may have a high bandwidth memory (HBM) chip structure.

Each of the first, second, third, and fourth semiconductor chips 100a, 100b, 100c, and 100d may include a substrate 1, an interlayer dielectric layer 3, wiring lines 5, first conductive pads 7, conductive bumps 140, a first passivation layer 9, and a second passivation layer 15 and one or more of the first, second, third, and fourth semiconductor chips 100a, 100b, 100c, and 100d may further include at least second conductive pads 21. Respective elements of the first, second, third, and fourth semiconductor chips 100a, 100b, 100c, and 100d may be referred to as respective first, second, third, and fourth elements thereof. For example, the substrate 1 of the first semiconductor chip 100a may be referred to as a first substrate, one or more of the first and/or second conductive pads 7 and/or 21 of the first semiconductor chip 100a may be referred to as a first conductive pad, etc.

The substrate 1 of one or more semiconductor chips may have a substrate top surface 1b and a substrate bottom surface 1a that are opposite to each other. For example, as shown in FIG. 1, the first semiconductor chip 100a may include a substrate 1, referred to as a first substrate, that has a top surface 1b and a bottom surface 1a that are opposite to each other, and the second semiconductor chip 100b may include a substrate 1, referred to as a second substrate, that has a top surface 1b and a bottom surface 1a that are opposite to each other. As described herein, the one or more semiconductor chips may include one or more of the first, second, third, and/or fourth semiconductor chips 100a, 100b, 100c, and/or 100d. The interlayer dielectric layer 3 of one or more semiconductor chips may be disposed on (e.g., directly or indirectly beneath) the substrate bottom surface 1a of the one or more semiconductor chips such that the interlayer dielectric layer 3 of the one or more semiconductor chips is understood to cover the bottom surface 1a of the substrate 1 of the one or more semiconductor chips. The interlayer dielectric layer 3 may have therein transistors (not shown) and the wiring lines 5 that are multi-layered. The interlayer dielectric layer 3 of one or more semiconductor chips may cover (e.g., partially or completely enclose) wiring lines 5 that are thus understood to be on (e.g., directly or indirectly beneath) the substrate bottom surface 1a of the one or more semiconductor chips. The interlayer dielectric layer 3 may be covered with the first passivation layer 9 of the one or more semiconductor chips. The first conductive pads 7 of one or more semiconductor chips may be disposed below the interlayer dielectric layer 3 of the one or more semiconductor chips. The conductive bumps 140 of one or more semiconductor chips may be correspondingly bonded to the first conductive pads 7 of the one or more semiconductor chips. A solder layer 150 may be bonded below the conductive bumps 140 of the first semiconductor chip 100a. The substrate top surface 1b of one or more semiconductor chips may be covered (e.g., directly or indirectly covered) with the second passivation layer 15 of the one or more semiconductor chips. In some example embodiments, the second passivation layer 15 of one or more semiconductor chips may be referred to as a passivation layer that covers a top surface 1b of the substrate 1 of the one or more semiconductor chips.

Each of the first, second, and third semiconductor chips 100a, 100b, and 100c may further include through vias 11 and through dielectric layers 13. Each of the first, second, and third semiconductor chips 100a, 100b, and 100c may be configured such that the through via 11 may penetrate the second passivation layer 15, the substrate 1, and a portion of the interlayer dielectric layer 3. The through dielectric layer 13 of one or more semiconductor chips may be interposed between the substrate 1 and the through via 11 of the one or more semiconductor chips. The through via 11 of one or more semiconductor chips may have a top surface in contact with the second conductive pad 21 of the one or more semiconductor chips. For example, a though via 11 of the first semiconductor chip 100a may penetrate the substrate 1 of the first semiconductor chip 100a and may be in contact with the second conductive pad 21 of the first semiconductor chip 100a. The through via 11 of one or more semiconductor chips may have a bottom surface coupled to one of the wiring lines 5 of the one or more semiconductor chips.

The fourth semiconductor chip 100d may exclude the through via 11 and the through dielectric layer 13. The substrate 1 included in the fourth semiconductor chip 100d may have a thickness less (e.g., smaller) than that of the substrate 1 included in either the second semiconductor chip 100b or the third semiconductor chip 100c.

The first, second, third, and fourth semiconductor chips 100a, 100b, 100c, and 100d may be connected to each other through internal connection members 160. Restated, the semiconductor package 1000 may include internal connection members 160 that lie between adjacent semiconductor chips of the first to fourth semiconductor chips 100a to 100d and each connect the adjacent semiconductor chips to each other, such that the internal connection members 160 of the semiconductor package 1000 collectively connect the first to fourth semiconductor chips 100a to 100d to each other. Each of the internal connection members 160 may connect the second conductive pad 21 of an underlying one of the first, second, third, and fourth semiconductor chips 100a, 100b, 100c, and 100d to the conductive bump 140 of a next overlying one of the first, second, third, and fourth semiconductor chips 100a, 100b, 100c, and 100d. For example, as shown in FIG. 1, an internal connection member 160 may connect the first semiconductor chip 100a to the second semiconductor chip 100b, for example based on connecting a second conductive pad 21 of the first semiconductor chip 100a to a conductive bump 140 of the second semiconductor chip 100b. As shown, the first semiconductor chip 100a may include a second conductive pad 21 on the top surface 1b of the substrate of the first semiconductor chip 100a, and the second semiconductor chip 100b may include a conductive bump 140 on the bottom surface 1a of the substrate 1 of the second semiconductor chip 100b, and an internal connection member 160 may connect the second conductive pad 21 of the first semiconductor chip 100a to the conductive bump 140 of the second semiconductor chip 100b. In some example embodiments, the first conductive pad 7 of the second semiconductor chip 100b may be between the substrate 1 of the second semiconductor chip 100b and the conductive bump 140 of the second semiconductor chip 100b and further is in contact with the conductive bump 140 of the second semiconductor chip 100b. The first conductive pad 7 of the second semiconductor chip 100b may be understood to be adjacent to a bottom surface 1a of the substrate 1 of the second semiconductor chip 100b. Under-fill layers UF may be interposed between (e.g., directly between) the first, second, third, and fourth semiconductor chips 100a, 100b, 100c, and 100d.

The substrates 1 may each be a semiconductor substrate, a single-crystalline silicon substrate, or a silicon-on-insulator (SOI) substrate. The interlayer dielectric layers 3 may each include a single or multiple layer including one or more of a silicon oxide layer, a silicon nitride layer, a silicon oxynitride layer, and a porous dielectric layer. The mold layer MD may include a dielectric resin, for example, an epoxy molding compound (EMC). The mold layer MD may further include filler, which fillers may be dispersed in the dielectric resin. The fillers may include, for example, silicon oxide ($SiO_2$). The under-fill layer UF may include a thermo-curable resin or a photo-curable resin. In addition, the under-fill layer UF may further include organic fillers or inorganic fillers.

The first conductive pads 7, the second conductive pads 21, the conductive bumps 140, the solder layers 150, the wiring lines 5, and through vias 11 may include a conductive material, such as metal. The solder layers 150 may include, for example, SnAg. The wiring lines 5 may independently include, for example, one or more of copper, tungsten, aluminum, ruthenium, titanium, tantalum, titanium nitride, and tantalum nitride. The through vias 11 may include, for example, tungsten.

Figure 2A:
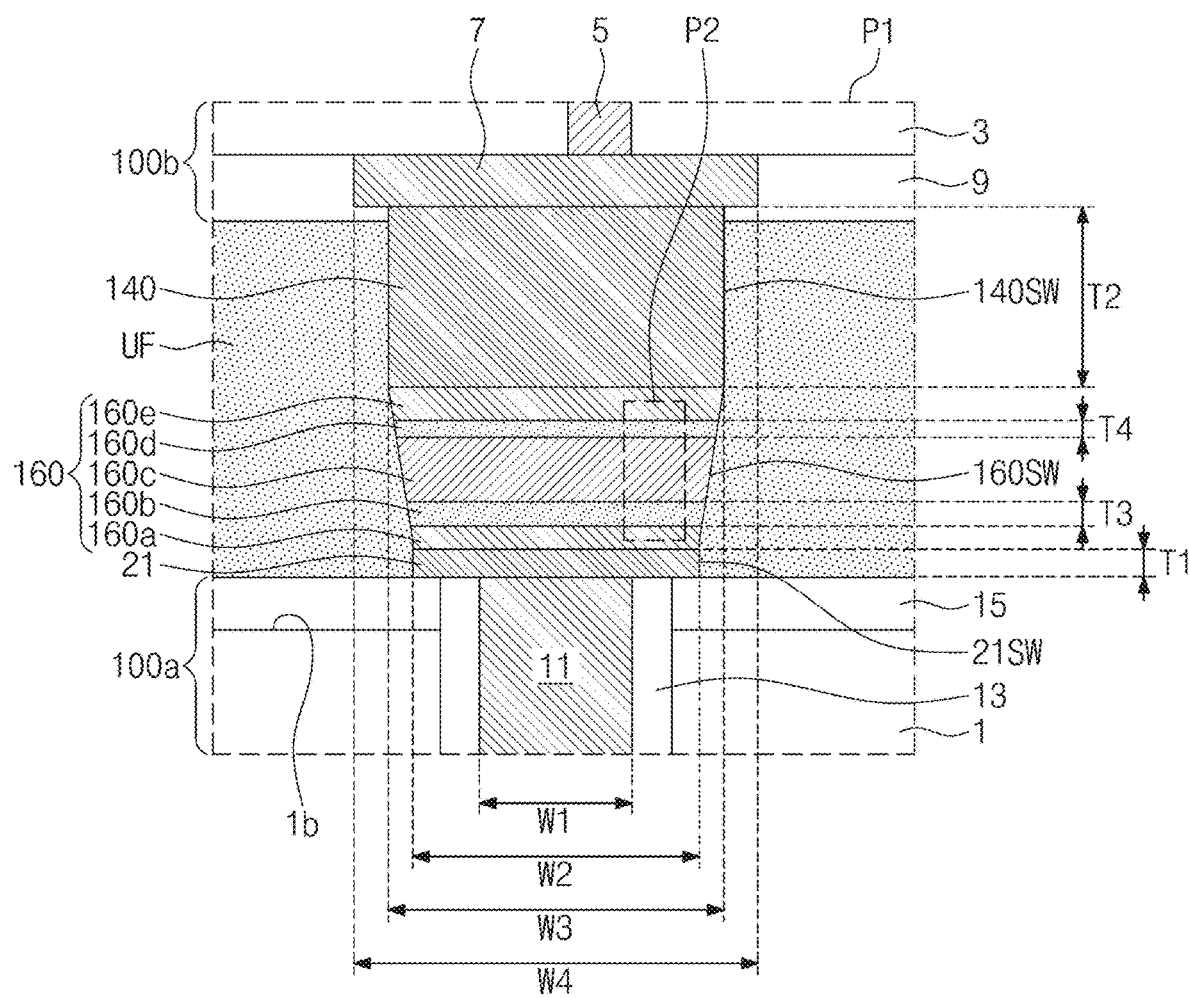
FIG. 2A illustrates an enlarged view showing section P1 of FIG. 1 according to some example embodiments of the present inventive concepts.
Figure 2B:
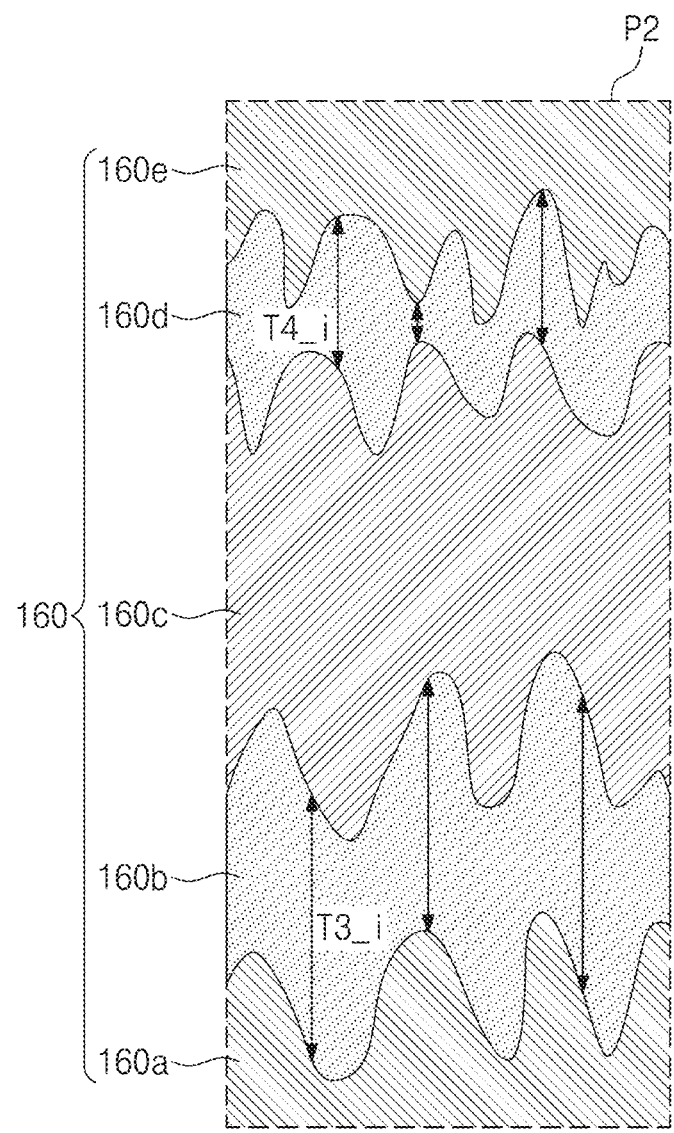
FIG. 2B illustrates an enlarged view showing section P2 of FIG. 2A according to some example embodiments of the present inventive concepts.
Figure 2C:
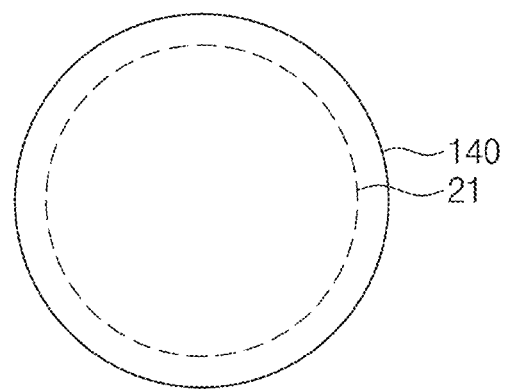
FIG. 2C illustrates a plan view showing a conductive bump and a second conductive pad according to some example embodiments of the present inventive concepts.

FIG. 2A illustrates an enlarged view showing section P1 of FIG. 1. FIG. 2B illustrates an enlarged view showing section P2 of FIG. 2A. FIG. 2C illustrates a plan view showing a conductive bump and a second conductive pad according to some example embodiments of the present inventive concepts.

Referring to FIG. 2A, the second passivation layer 15 may include a silicon oxide layer and a silicon nitride layer that are sequentially stacked. The through via 11 and the through dielectric layer 13 may penetrate the second passivation layer 15. The through dielectric layer 13 may include, for example, a silicon oxide layer. The through via 11 and the through dielectric layer 13 may have their top surfaces coplanar with that of the second passivation layer 15. The second conductive pad 21 may be on (e.g., indirectly above) the top surface 1b and may contact the top surface of the through via 11, the top surface of the through dielectric layer 13, and a portion of the top surface of the second passivation layer 15.

The second semiconductor chip 100b may be configured such that the first conductive pad 7 may contact a bottom surface of the interlayer dielectric layer 3. The first conductive pad 7 may be connected to one of the wiring lines 5. The first passivation layer 9 may cover the bottom surface of the interlayer dielectric layer 3. The first passivation layer 9 may be formed of, for example, a silicon nitride layer, a polyimide layer, or a photo-solder resist (PSR). The first passivation layer 9 may cover a lateral surface of the first conductive pad 7 and a portion of a bottom surface of the first conductive pad 7. The first passivation layer 9 may partially contact an upper sidewall of the conductive bump 140. As shown in at least FIG. 2A, the under-fill layer UF may contact the top surface of the second passivation layer 15, a lateral surface of the second conductive pad 21, a lateral surface of the internal connection member 160, a lateral surface of the conductive bump 140, and a bottom surface of the first passivation layer 9. Restated, the under-fill layer UF may be in simultaneous contact (e.g., direct contact) with a sidewall 21SW of the second conductive pad 21, a sidewall 140SW of the conductive bump 140, and a sidewall 160SW of the internal connection member 160.

The through via 11 may have a first width W1 in a first direction X (which may be referred to herein as a third width in the first direction X). The first width W1 may range, for example, equal to or greater (e.g., larger) than about 4 μm. The second conductive pad 21 may have a second width W2 in the first direction X (which may be referred to herein as a first width in the first direction X) which may be greater (e.g., larger) than the first width W1 (e.g., third width) of the through via 11. For example, the second width W2 may range from about 4 μm to about 14 μm. The conductive bump 140 may have a third width W3 in the first direction X greater (e.g., larger) than the second width W2. For example, where the first semiconductor chip 100a includes a second conductive pad 21 on the top surface 1b of the substrate 1 of the first semiconductor chip 100a, and where the second semiconductor chip 100b includes a conductive bump 140 on the bottom surface 1a of the substrate 1 of the second semiconductor chip 100b, the second conductive pad 21 of the first semiconductor chip 100a may have a second width W2 in one direction (e.g., the first direction X which may be parallel to the top surface 1b of the first semiconductor chip 100a) and the conductive bump 140 of the second semiconductor chip 100b may have a third width W3 in the one direction, where the second width W2 is less (e.g., smaller) than the third width W3. The first conductive pad 7 of the second semiconductor chip 100b may have a fourth width W4 in the first direction X that is greater (e.g., larger) than the third width W3. The internal connection member may have an inclined sidewall 160SW. The internal connection member 160 may have a width that increases as approaching the conductive bump 140 from the second conductive pad 21, or that increases in a second direction Z. Restated, the width in the first direction X of the internal connection member 160 may narrow with increased proximity to the second conductive pad 21 of the first semiconductor chip 100a and/or a width of a given cross-sectional area of the internal connection member 160 in the first direction X may have a magnitude that is inversely proportional to a distance of said cross-sectional area from the second conductive pad 21 of the first semiconductor chip 100a in the second direction Z. In some example embodiments, the internal connection member 160 may have a width that decreased, or linearly decreases, as approaching the second conductive pad 21 of the first semiconductor chip 100a from the conductive bump 140 of the second semiconductor chip 100b. For example, the second width W2 may be about 0.8 to 0.9 times the third width W3.

Referring to FIG. 2C, each of the conductive bump 140 and the second conductive pad 21 of one or more semiconductor chips may have a circular shape when viewed in plan. The second conductive pad 21 may have a top or bottom surface whose area is about 0.64 to 0.81 times that of a top or bottom surface of the conductive bump 140.

Each of the first, second, and third semiconductor chips 100a, 100b, and 100c may be configured such that the second conductive pad 21 of one or more semiconductor chips may have a width less (e.g., smaller) than that of the conductive bump 140 of one or more semiconductor chips (e.g., the same semiconductor chip, adjacent separate semiconductor chips, all semiconductor chips, etc.). For example, the first semiconductor chip 100a may be configured such that the second conductive pad 21 of the first semiconductor chip 100a may have a width less (e.g., smaller) than that of the conductive bump 140 of the first semiconductor chip 100a and/or of the second semiconductor chip 100b.

The first conductive pad 7 of one or more semiconductor chips may include, for example, aluminum. In some example embodiments, the second conductive pad 21 of one or more semiconductor chips and the conductive bump 140 of one or more semiconductor chips (e.g., the second conductive pad 21 of the first semiconductor chip 100a and the conductive bump 140 of the second semiconductor chip 100b) may include the same first metal. The second conductive pad 21 of one or more semiconductor chips (e.g., the second conductive pad 21 of the first semiconductor chip 100a) may have a first thickness T1 in the second direction Z. The conductive bump 140 of one or more semiconductor chips (e.g., the conductive bump 140 of the second semiconductor chip 100b) may have a second thickness T2 in the second direction Z greater (e.g., larger) than the first thickness T1.

The internal connection member 160 may include the first metal, and may further include second, third, and fourth metals. In some example embodiments, the internal connection member 160 may include second, third, and fourth metals and may or may not include the first metal. The first to fourth metals may be different from each other. The internal connection member 160 may have first, second, third, fourth, and fifth connection regions 160a, 160b, 160c, 160d, and 160e that are sequentially stacked based on distribution of the metals. The first connection region 160a may contact the second conductive pad 21 (which may be a first conductive pad of the first semiconductor chip 100a). The fifth connection region 160e may contact the conductive bump 140 (which may be a second conductive bump of the second semiconductor chip 100b). The second connection region 160b and the fourth connection region 160d may each be spaced apart from (e.g., isolated from direct contact with) the second conductive pad 21 and the conductive bump 140. In some example embodiments, the internal connection member 160 may have a center that overlaps a center of the through via 11 of the first semiconductor chip 100a.

The first connection region 160a and the fifth connection region 160e may each include the first metal and the second metal, but may each exclude both the third metal and the fourth metal (e.g., may not include either of the third metal or the fourth metal). The third connection region 160c may include the second metal and the third metal, but may exclude both the first metal and the fourth metal (e.g., may not include either of the first metal or the fourth metal). The second connection region 160b and the fourth connection region 160d may each include the first metal, the second metal, and the fourth metal, but may each exclude (e.g., may not include) the third metal. For example, the first metal may be nickel (Ni), the second metal may be tin (Sn), the third metal may be silver (Ag), and the fourth metal may be gold (Au). In this case, the second connection region 160b and the fourth connection region 160d may all include gold, and the first, third, and fifth connection regions 160a, 160c, and 160e may all exclude gold. In addition, the second conductive pad 21 and the conductive bump 140 may exclude gold.

For example, the first connection region 160a and the fifth connection region 160e may each include $Ni_3Sn_4$. The third connection region 160c may include $Sn_{1.8}Ag$. The second connection region 160b and the fourth connection region 160d may each include $(Au, Ni)Sn_4$.

Referring to FIGS. 2A and 2B, the first to fifth connection regions 160a to 160e may have therebetween boundaries that are not flat, but are changed depending on their position. For example, the second connection region 160b may have third thicknesses T3_i that are changed depending on a position X. The fourth connection region 160d may have fourth thicknesses T4_i that are changed depending on a position X. The second connection region 160b may have a third average thickness T3 (which may be referred to herein as a first average thickness of the second connection region 160b), or an average of the third thicknesses T3_i. The fourth connection region 160d may have a fourth average thickness T4 (which may be referred to herein as a second average thickness of the fourth connection region 160d), or an average of the fourth thicknesses T4_i. For example, the third average thickness T3 may be greater (e.g., larger) than the fourth average thickness T4.

The internal connection members 160 between the first to fourth semiconductor chips 100a to 100d shown in FIG. 1 may each have a structure the same as or similar to that discussed with reference to FIGS. 2A and 2B. The internal connection member 160 may include therein no void or crack, and thus the semiconductor package 1000 may increase in reliability.

Figure 3A:
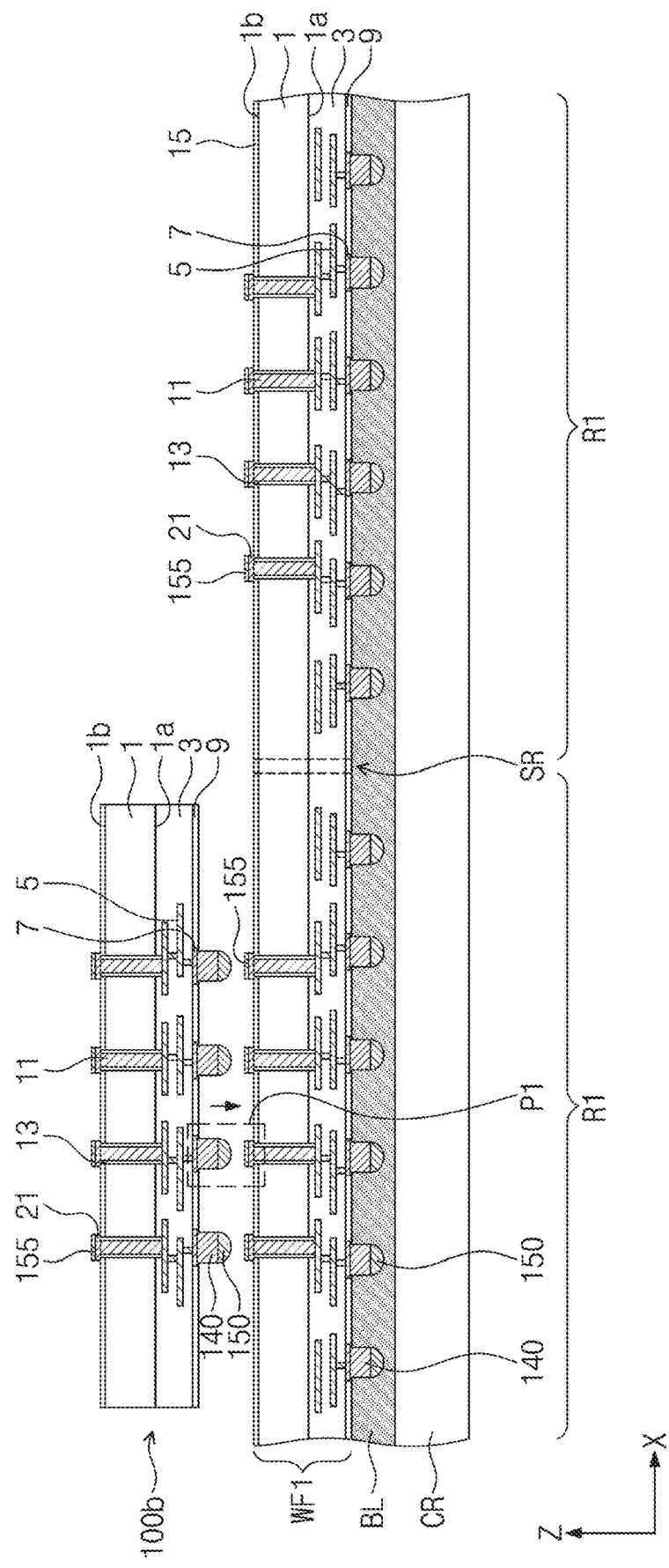
FIGS. 3A and 3B illustrate cross-sectional views showing a method of fabricating the semiconductor package of FIG. 1, according to some example embodiments of the present inventive concepts.
Figure 3B:
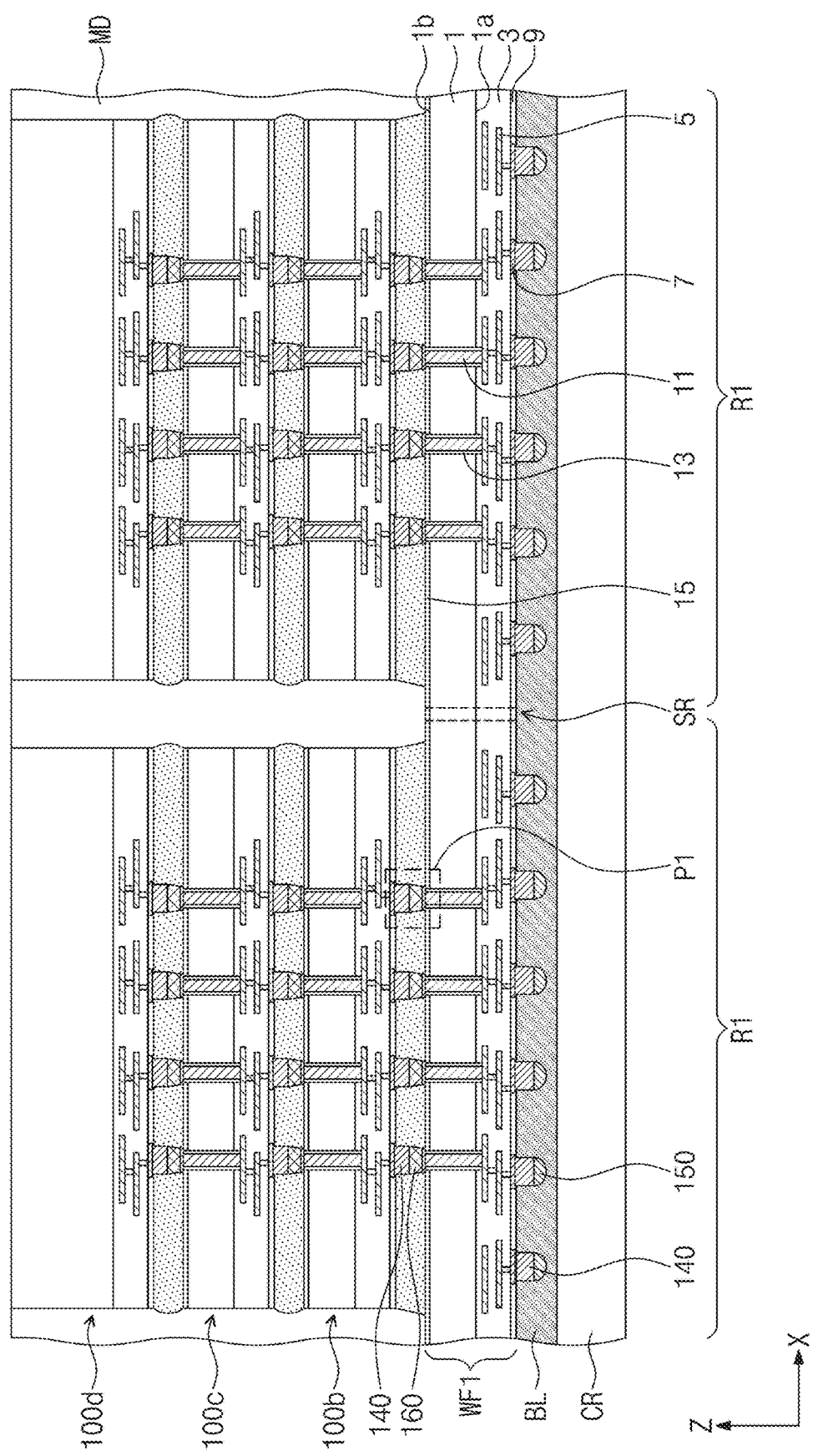
Figure 4:
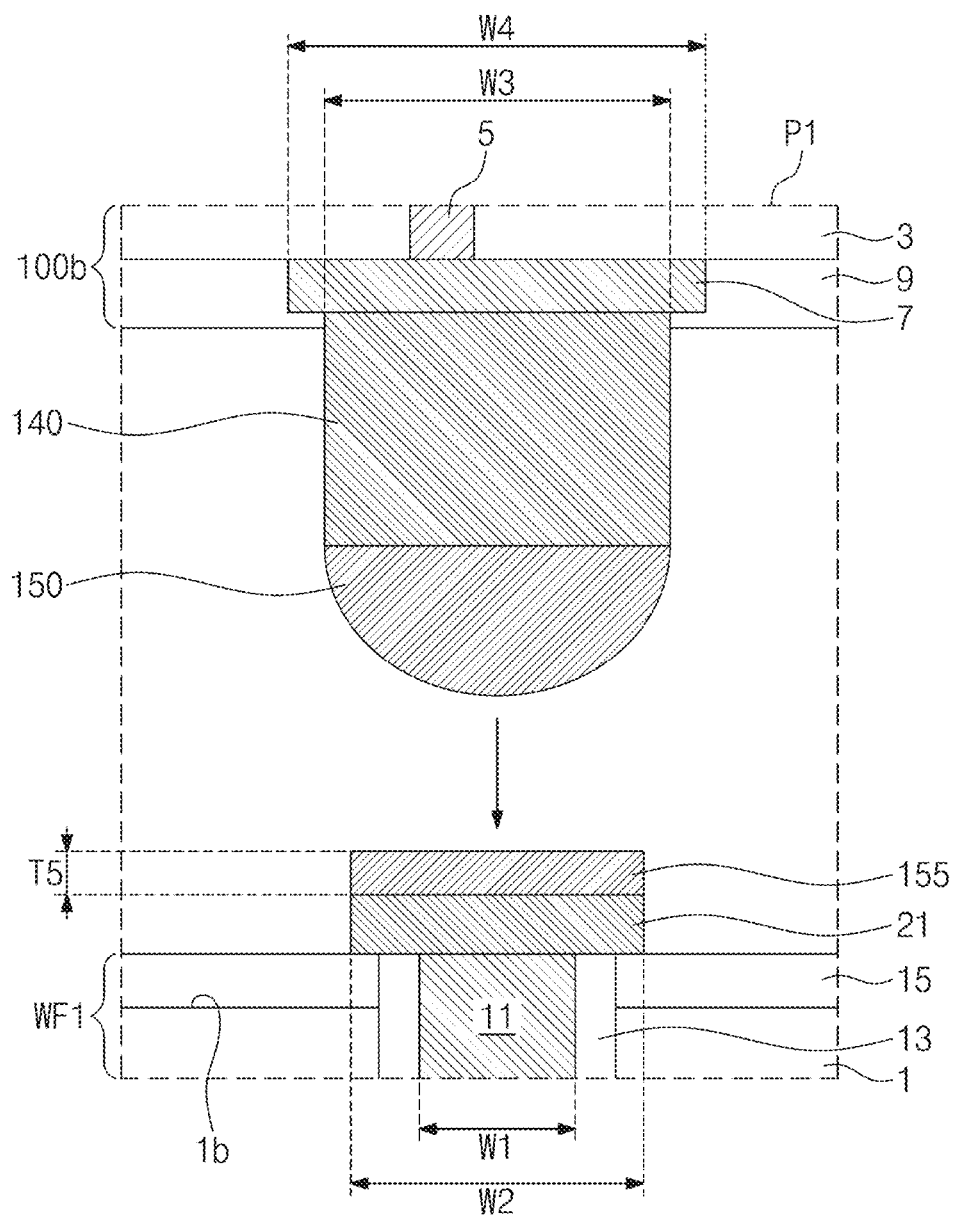
FIG. 4 illustrates an enlarged view showing section P1 of FIG. 3A according to some example embodiments of the present inventive concepts.

FIGS. 3A and 3B illustrate cross-sectional views showing a method of fabricating the semiconductor package of FIG. 1, according to some example embodiments of the present inventive concepts. FIG. 4 illustrates an enlarged view showing section P1 of FIG. 3A, according to some example embodiments of the present inventive concepts.

Referring to FIG. 3A, a wafer structure WF1 may be prepared. The wafer structure WF1 may have a plurality of chip regions R1 and a separation region SR therebetween. The separation region SR may be a scribe lane region. The wafer structure WF1 may include a substrate 1. The substrate 1 may have a substrate top surface 1b and a substrate bottom surface 1a that are opposite to each other. Transistors (not shown) may be formed on the substrate bottom surface 1a, and a portion of an interlayer dielectric layer 3 may be formed to cover the transistors. The portion of the interlayer dielectric layer 3 and the substrate 1 may be etched to form a through hole, and a through via 11 and a through dielectric layer 13 may be formed in the through hole. Wiring lines 5 may be formed to contact the through via 11, and a remainder of the interlayer dielectric layer 3 may be formed. First conductive pads 7 and a first passivation layer 9 may be formed on the interlayer dielectric layer 3. Conductive bumps 140 may be formed on the first conductive pads 7, and solder layers 150 may be bonded to the conductive bumps 140. The wafer structure WF1 may be attached through an adhesive layer BL to a carrier substrate CR.

Referring to FIGS. 3A and 4, one or both of grinding and etch-back processes may be performed on the substrate top surface 1b of the substrate 1, such that a portion of the substrate 1 may be removed to expose a top surface of the through via 11, a top surface of the through dielectric layer 13, and a portion of an upper sidewall of the through dielectric layer 13. A second passivation layer 15 may be conformally formed on the substrate top surface 1b, and then one or both of etch-back and polishing processes may be performed to expose the top surface of the through via 11 and the top surface of the through dielectric layer 13. A second conductive pad 21 and a wetting layer 155 may be sequentially formed on the through via 11. The second conductive pad 21 and the wetting layer 155 may have the same second width W2, and the second conductive pad 21 may be formed to have a sidewall aligned with that of the wetting layer 155. The second conductive pad 21 may include a first metal (e.g., nickel). The wetting layer 155 may include, for example, a fourth metal (e.g., gold).

A second semiconductor chip 100b may be positioned on the chip region R1 of the wafer structure WF1. As discussed in FIG. 1, the second semiconductor chip 100b may include a substrate 1, an interlayer dielectric layer 3, wiring lines 5, first conductive pads 7, a first passivation layer 9, conductive bumps 140, and solder layers 150. The conductive bump 140 may include the first metal (e.g., nickel). The solder layer 150 may include a second metal (e.g., tin) and a third metal (e.g., silver). In addition, the second semiconductor chip 100b may further include through vias 11, through dielectric layers 13, a second passivation layer 15, second conductive pads 21, and wetting layers 155.

Referring to FIG. 4, the second width W2 of each of the wetting layer 155 and the second conductive pad 21 on the wafer structure WF1 may be less (e.g., smaller) than a third width of the conductive bump 140 included in the second semiconductor chip 100b. For example, the second width W2 may be about 0.8 to 0.9 times the third width W3. The second width W2 may range, for example, from about 4 μm to about 14 μm. The wetting layer 155 may have a fifth thickness T5. The fifth thickness T5 may range, for example, from about 0.10 μm to about 0.30 μm. Afterwards, the second semiconductor chip 100b may be positioned on the wafer structure WF1 so as to allow the solder layer 150 and the wetting layer 155 to contact each other, and then a thermal compression process may be performed to bond the solder layer 150 to the wetting layer 155 and simultaneously to form an internal connection member 160 of FIG. 2A. In this case, the second metal (e.g., tin) may diffuse from the solder layer 150 into the second conductive pad 21 and the conductive bump 140. In addition, the fourth metal (e.g., gold) may diffuse from the wetting layer 155 into the conductive bump 140. The diffusion of the second metal (e.g., tin) and the fourth metal (e.g., gold) may form first, second, third, fourth, and fifth connection regions 160a, 160b, 160c, 160d, and 160e of FIG. 2A.

In the present inventive concepts, because the fifth thickness T5 of the wetting layer 155 is greater (e.g., larger) than about 0.10 μm, the solder layer 150 and the wetting layer 155 may be satisfactorily bonded to each other without process fail. When the fifth thickness T5 of the wetting layer 155 is less than about 0.10 μm, the wetting layer 155 may be excessively thin to possibly expose a surface of the second conductive pad 21, and accordingly a problem may occur in which the solder layer 150 is not bonded to the wetting layer 155 or the second conductive pad 21.

Referring to FIG. 3B, identically or similarly to that discussed with reference to FIGS. 3A and 4, a third semiconductor chip 100c and a fourth semiconductor chip 100d may be sequentially stacked on the second semiconductor chip 100b, and then thermal compression processes may be sequentially performed. In some example embodiments, second to fourth semiconductor chips 100b to 100d may be sequentially stacked on each of the chip regions R1 of the wafer structure WF1, and then a thermal compression process may be performed a single time to simultaneously form all of internal connection members 160. Under-fill layers UF may be formed between the wafer structure WF1 and the second semiconductor chips 100b and between the second, third, and fourth semiconductor chips 100b, 100c, and 100d. A mold layer MD may be formed to cover the wafer structure WF1 and the second, third, and fourth semiconductor chips 100b, 100c, and 100d.

Subsequently, referring to FIG. 1, the carrier substrate CR and the adhesive layer BL may be removed. A singulation process using a laser may be performed such that the wafer structure WF1 and the mold layer MD on the separation region SR may be removed to fabricate a plurality of semiconductor packages 1000. A high-temperature storage (HTS) reliability test may be executed after the semiconductor package 1000 is fabricated as discussed above. For example, the HTS reliability test may be performed for about 1000 hours at about 150° C.

In the present inventive concepts, since the wetting layer 155 has the second width W2 relatively less (e.g., smaller) than the third width W3, an overall amount of the fourth metal (e.g., gold) that constitutes the wetting layer 155 may be relatively less (e.g., smaller) than an amount of the second metal (e.g., tin) included in the solder layer 150. Therefore, the second connection region 160b and the fourth connection region 160d may have their relative small average thicknesses T3 and T4, respectively, and the third connection region 160c may have a relatively large thickness. In this case, the third connection region 160c may still remain even after the HTS reliability test on the semiconductor package 1000. Therefore, the third connection region 160c may have therein no void or crack, and accordingly the semiconductor package 1000 may increase in reliability.

In contrast, when the second width W2 of the wetting layer 155 is the same as or greater (e.g., larger) than the third width W3 of the conductive bump 140, the wetting layer 155 may have a large amount of the fourth metal (e.g., gold) included therein. Therefore, the second connection region 160b and the fourth connection region 160d may have their relative large average thicknesses T3 and T4, respectively, and the third connection region 160c may have a relatively small thickness. In this case, after the HTS reliability test on the semiconductor package 1000, most or all of each of the second metal (e.g., tin) and the third metal (e.g., silver) may migrate from the third connection region 160c into the second connection region 160b and the fourth connection region 160d, which migration may form an intermetallic compound. This metal chemical reaction may induce a reduction in volume, and thus the third connection region 160c may be perished or may have a void or crack therein. An open defect may occur in which the semiconductor chips 100a to 100d are not connected to each other, and accordingly the semiconductor package 1000 may decrease in reliability. A reduction in size of the conductive bump 140 may urge such issues to dominantly affect reliability of the semiconductor package 1000.

In the present inventive concepts, while the thickness T5 of the wetting layer 155 is kept equal to or greater (e.g., larger) than a certain value required to ensure process reliability, the width W2 of the wetting layer 155 may become relatively reduced to comparatively decrease an overall amount of the fourth metal (e.g., gold) included in the wetting layer 155, and thus the formation of intermetallic compound including gold may hardly occur to thereby reduce or prevent the internal connection member 160 from suffering from void or crack.

Figure 5:
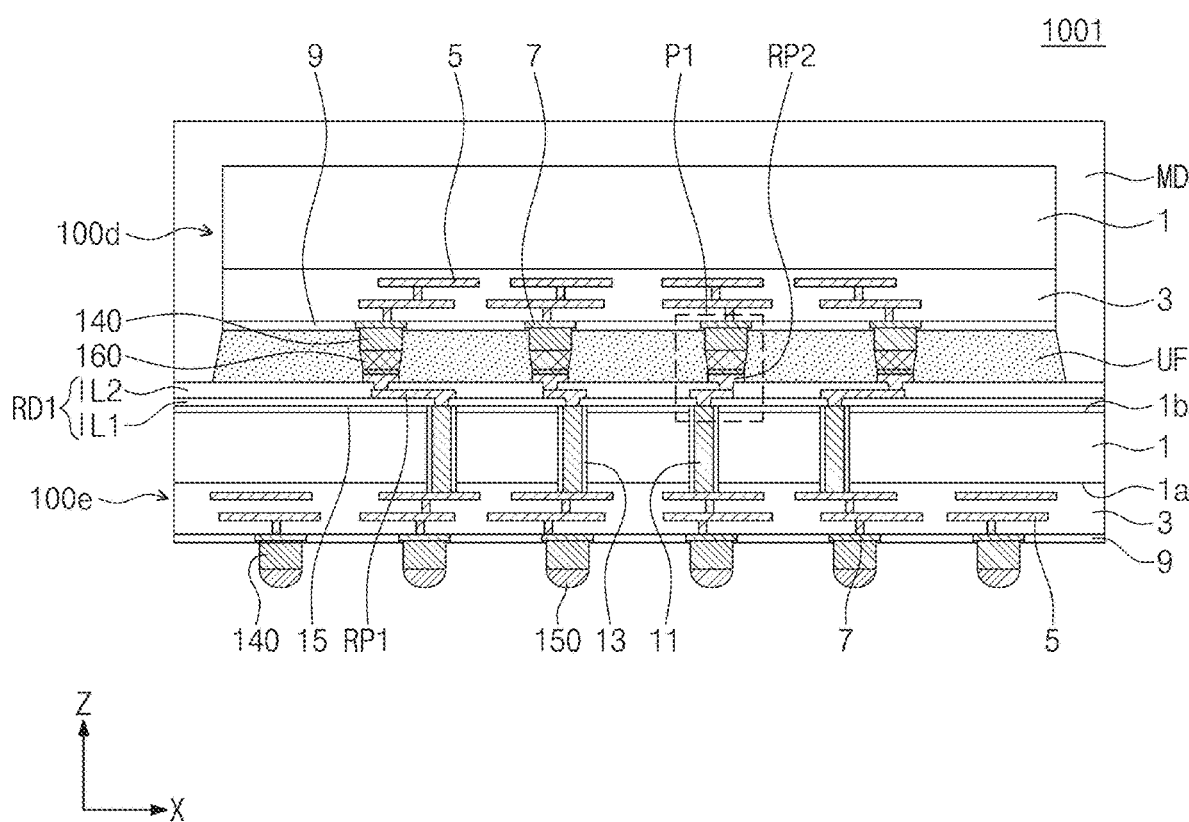
FIG. 5 illustrates a cross-sectional view showing a semiconductor package according to some example embodiments of the present inventive concepts.
Figure 6:
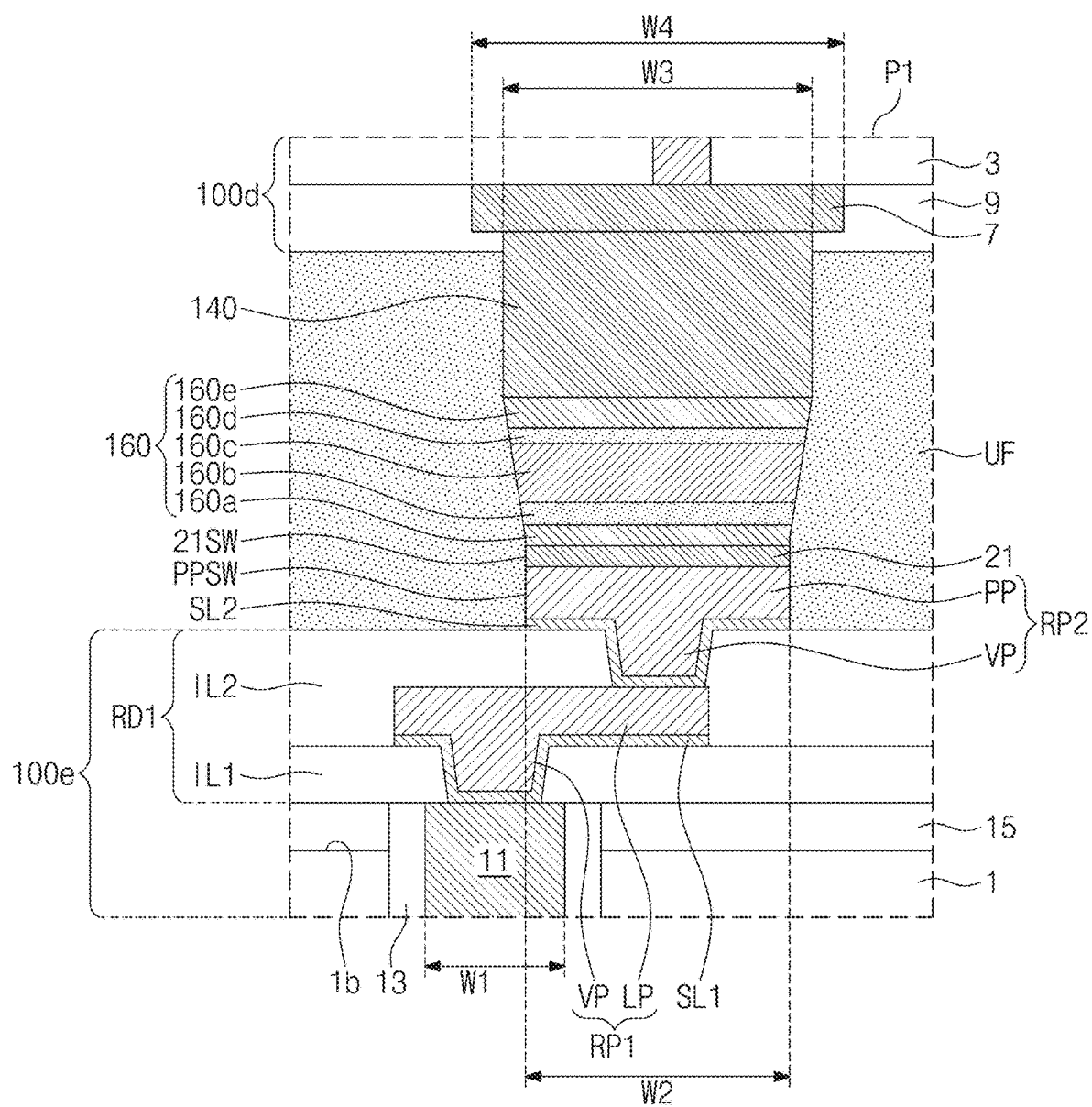
FIG. 6 illustrates an enlarged view showing section P1 of FIG. 5 according to some example embodiments of the present inventive concepts.

FIG. 5 illustrates a cross-sectional view showing a semiconductor package according to some example embodiments of the present inventive concepts. FIG. 6 illustrates an enlarged view showing section P1 of FIG. 5.

Referring to FIGS. 5 and 6, a semiconductor package 1001 according to some example embodiments may include a fifth semiconductor chip 100e, a fourth semiconductor chip 100d mounted on the fifth semiconductor chip 100e, and a mold layer MD that covers the fourth and fifth semiconductor chips 100d and 100e. The fourth semiconductor chip 100d and the fifth semiconductor chip 100e may independently be one selected from an image sensor chip such as CMOS image sensor (CIS), a flash memory chip, a dynamic random access memory (DRAM) chip, a static random access memory (SRAM) chip, an electrical erasable programmable read only memory (EEPROM) chip, a phase change random access memory (PRAM) chip, a magnetic random access memory (MRAM) chip, and a resistive random access memory (ReRAM) chip.

The fifth semiconductor chip 100e may include components of the first semiconductor chip 100a of FIG. 1, and may further include a first redistribution substrate RD1 disposed on the second passivation layer 15. The first redistribution substrate RD1 may include a first dielectric layer IL1 and a second dielectric layer IL2 that are sequentially stacked and each of which may be understood to be between the second conductive pad 21 of the fifth semiconductor chip 100e and the substrate 1 of the fifth semiconductor chip 100e, as shown in at least FIG. 6. The first dielectric layer IL1 and the second dielectric layer IL2 may each include a photo-imageable dielectric (PID) layer. The first dielectric layer IL1 may contact the second passivation layer 15.

Referring to FIG. 6, a first redistribution pattern RP1 may be interposed between (e.g., directly between) the first dielectric layer IL1 and the second dielectric layer IL2. The first redistribution pattern RP1 may include a via part VP that penetrates the first dielectric layer IL1 to have a connection with the through via 11, and may also have a line part LP interposed between the first dielectric layer IL1 and the second dielectric layer IL2. A first barrier/seed layer SL1 may be interposed between the first redistribution pattern RP1 and the first dielectric layer IL1 and between the first redistribution pattern RP1 and the through via 11. A second redistribution pattern RP2 may be disposed on the second dielectric layer IL2. The second redistribution pattern RP2 may include a via part VP that penetrates the second dielectric layer IL2 to have a connection with the first redistribution pattern RP1, and may also include a pad part PP that protrudes onto the second dielectric layer IL2. A second barrier/seed layer SL2 may be interposed between the second redistribution pattern RP2 and the second dielectric layer IL2. The first redistribution pattern RP1 and the second redistribution pattern RP2 may include, for example, copper. The first barrier/seed layer SL1 and the second barrier/seed layer SL2 may each include a barrier layer and a seed layer that are sequentially stacked. The barrier layer may include, for example, one or more of titanium, tantalum, titanium nitride, and tantalum nitride. The seed layer may include, for example, copper.

In some example embodiments, the second dielectric layer IL2 may be referred to as a first dielectric layer between the second conductive pad 21 and the substrate 1 of the fifth semiconductor chip 100e, and the second redistribution pattern RP2 may be referred to as a first redistribution pattern having a via part VP that penetrates the first dielectric layer (IL2) and a pad part PP that protrudes on to the first dielectric layer (IL2).

The second conductive pad 21 may be disposed on the second redistribution pattern RP2 and may be in contact with the pad part PP of the second redistribution pattern RP2. The pad part PP of the second redistribution pattern RP2 may have a second width W2 the same as that of the second conductive pad 21. The pad part PP of the second redistribution pattern RP2 may have a sidewall PPSW aligned with (e.g., coplanar with) the sidewall 21SW of the second conductive pad 21.

Referring back to FIGS. 5 and 6, the fourth semiconductor chip 100d may include a substrate 1, an interlayer dielectric layer 3, wiring lines 5, a first passivation layer 9, first conductive pads 7, and conductive bumps 140. An internal connection member 160 may connect the conductive bump 140 of the fourth semiconductor chip 100d to the second conductive pad 21 of the fifth semiconductor chip 100e. In some example embodiments, the internal connection member 160 may have a center that does not overlap a center of the through via 11 of the fifth semiconductor chip 100e. An under-fill layer UF may be interposed between the fourth semiconductor chip 100d and the fifth semiconductor chip 100e. The under-fill layer UF may contact a sidewall of the second redistribution pattern RP2 and a top surface of the second dielectric layer IL2. Other configurations may be identical or similar to those discussed with reference to FIGS. 1 to 2B. The first redistribution substrate RD1 of FIGS. 5 and 6 may also be disposed on each of the semiconductor chips 100a to 100d of FIG. 1.

Figure 7:
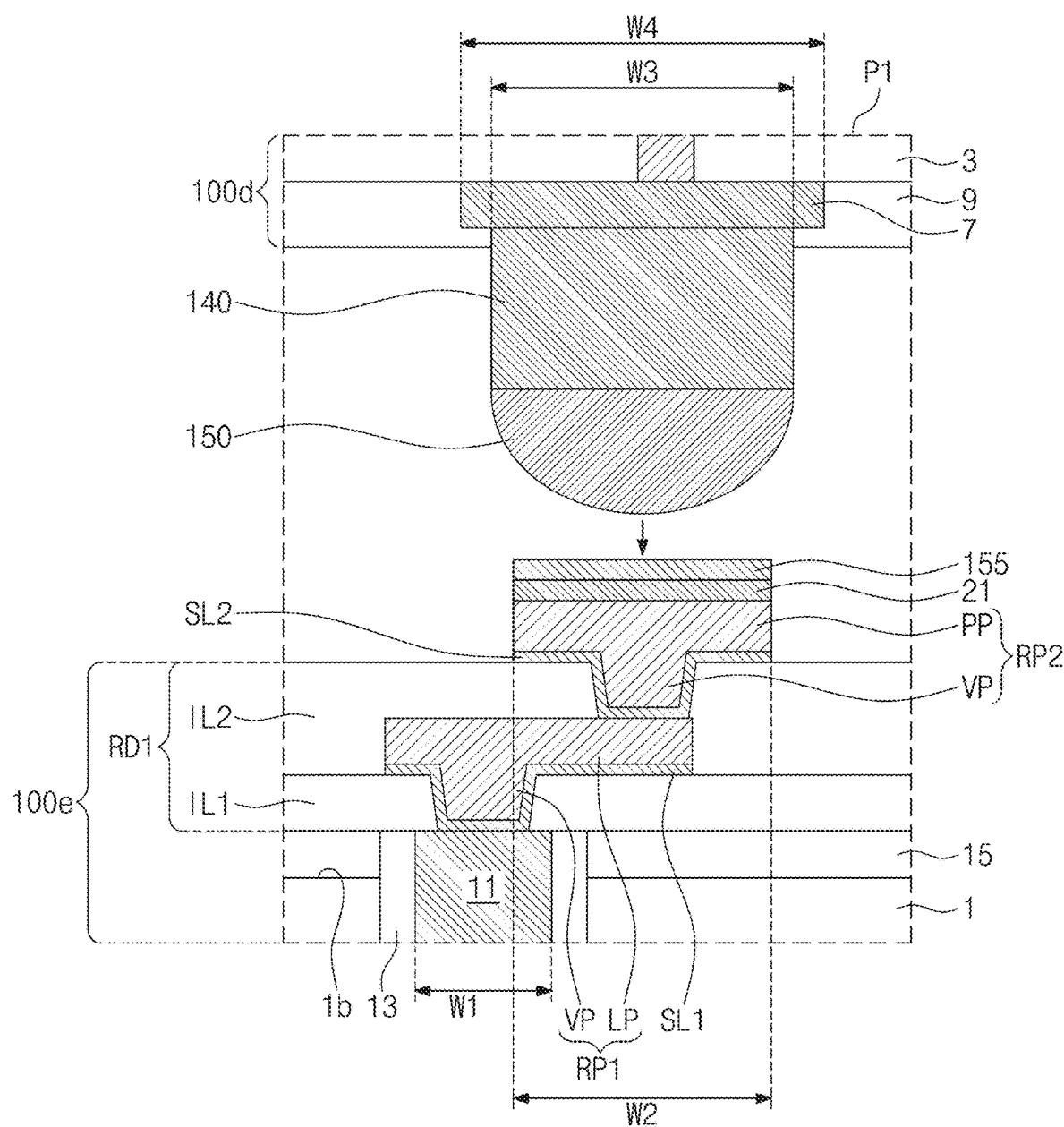
FIG. 7 illustrates a method of fabricating a semiconductor package having a structure of FIG. 6 according to some example embodiments of the present inventive concepts.

FIG. 7 illustrates a method of fabricating a semiconductor package having the structure of FIG. 6.

Referring to FIGS. 3A and 7, before a second conductive pad 21 and a wetting layer 155 are formed on the substrate top surface 1b of the wafer structure WF1, a first redistribution substrate RD1 may be formed on the structure of FIG. 3A. The first redistribution substrate RD1 may have a structure the same as or similar to that discussed with reference to FIG. 6. A second conductive pad 21 and a wetting layer 155 may be formed on the second redistribution pattern RP2 of the first redistribution substrate RD1. A fourth semiconductor chip 100d may be positioned on the wafer structure WF1. A solder layer 150 of the fourth semiconductor chip 100d may contact the wetting layer 155 of the wafer structure WF1, and then a thermal compression process may be performed to form an internal connection member 160 of FIG. 6. Subsequently, as discussed with reference to FIG. 3B, an under-fill layer UF and a mold layer MD may be formed, and then a singulation process may be performed to fabricate a semiconductor package 1001 of FIG. 5. Other configurations and fabrication processes may be identical or similar to those discussed with reference to FIGS. 3B and 4.

Figure 8:
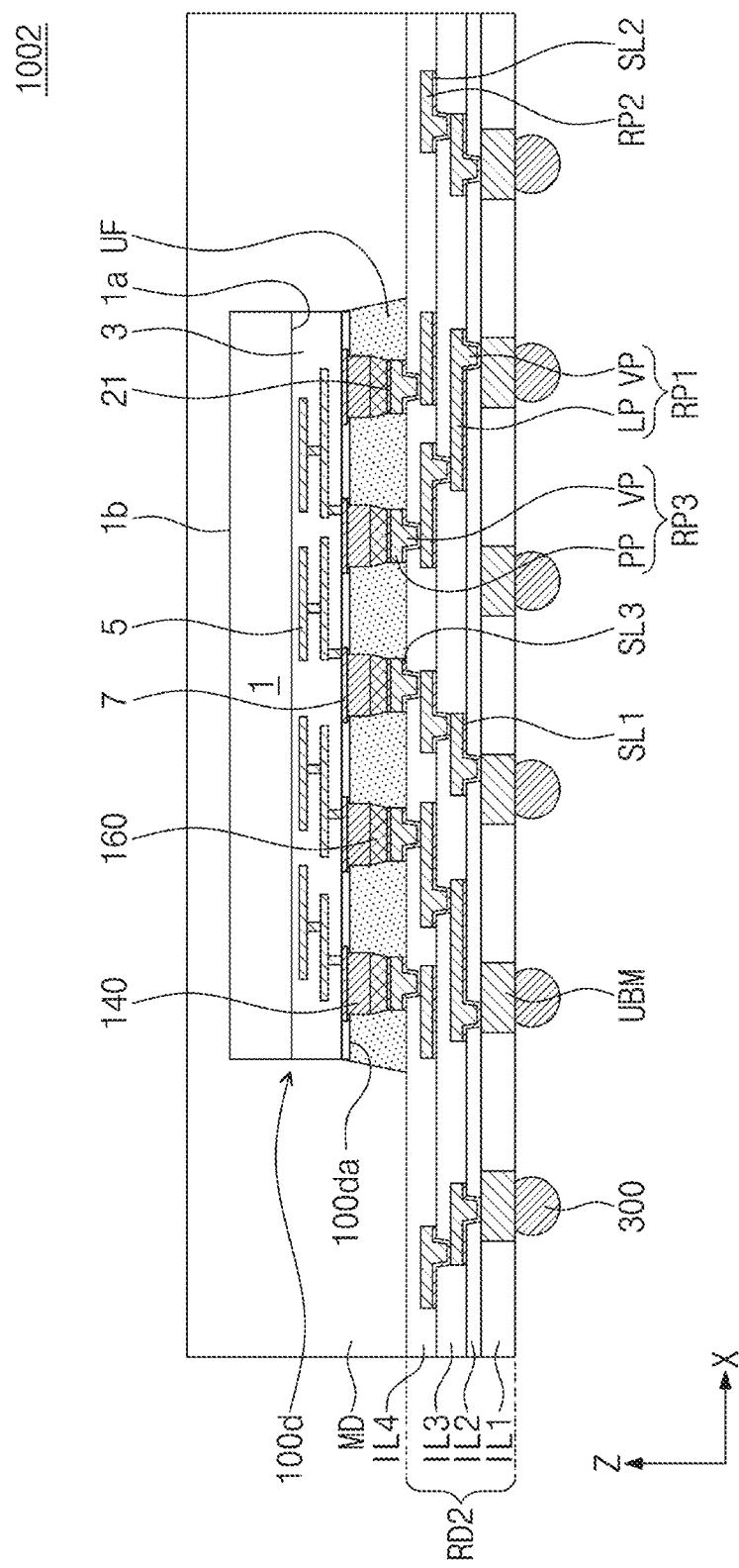
FIG. 8 illustrates a cross-sectional view showing a semiconductor package according to some example embodiments of the present inventive concepts.

FIG. 8 illustrates a cross-sectional view showing a semiconductor package according to some example embodiments of the present inventive concepts.

Referring to FIG. 8, a semiconductor package 1002 according to some example embodiments may include a second redistribution substrate RD2, a fourth semiconductor chip 100d mounted on the second redistribution substrate RD2 (e.g., through an internal connection member 160 on the second redistribution substrate RD2), and a mold layer MD that covers the fourth semiconductor chip 100d and the second redistribution substrate RD2. The second redistribution substrate RD2 may include first, second, third, and fourth dielectric layers IL1, IL2, IL3, and IL4 that are sequentially stacked. Each of the first to fourth dielectric layers IL1 to IL4 may include a photo-imageable dielectric (PID) layer. An under-bump UBM may be disposed in (e.g., within) the first dielectric layer IL1. External connection terminals 300 may be bonded to a bottom surface of the under-bumps UBM. The external connection terminals 300 may include, for example, one or more of conductive bumps, conductive pillars, and solder balls. As shown, the second dielectric layer IL2 may cover the first dielectric layer ILL A first redistribution pattern RP1 may be disposed between the third dielectric layer IL3 and the second dielectric layer IL2, such that the third dielectric layer IL3 may cover the first redistribution pattern RP1 and the second dielectric layer IL2. A second redistribution pattern RP2 may be disposed between the fourth dielectric layer IL4 and the third dielectric layer IL3. A third redistribution pattern RP3 may be disposed on the fourth dielectric layer IL4. The internal connection member 160 may be an internal connection member 160 according to any of the example embodiments and may include any of the connection regions according to any of the example embodiments.

A first barrier/seed layer SL1 may be interposed between the first redistribution pattern RP1 and the second dielectric layer IL2. A second barrier/seed layer SL2 may be interposed between the second redistribution pattern RP2 and the third dielectric layer IL3. A third barrier/seed layer SL3 may be interposed between the third redistribution pattern RP3 and the fourth dielectric layer IL4.

The first redistribution pattern RP1 and the second redistribution pattern RP2 may each include a via part VP and a line part LP. For example, the second redistribution pattern RP2 may include a first via part VP and a first line part LP, where the first via part VP penetrates the second dielectric layer IL2 and has a connection with the under-bump UBM (e.g., via the first redistribution pattern RP1), and the first line part LP may protrude onto the second dielectric layer IL2 (e.g., onto a top surface thereof) Likewise the second redistribution pattern RP2 of FIG. 6, the third redistribution pattern RP3 may include a via part VP and a pad part PP, where the via part VP may penetrate the third dielectric layer IL3 and may have a connection with the second redistribution pattern RP2, and the pad part PP may protrude onto the third dielectric layer IL3. A second conductive pad 21 may be disposed on the pad part PP of the third redistribution pattern RP3 and thus may be on (e.g., directly on) the third redistribution pattern RP3. The fourth semiconductor chip 100d may include a conductive bump 140 that protrudes outwardly from a bottom surface 100da of the fourth semiconductor device 100d. An internal connection member 160 may connect the conductive bump 140 of the fourth semiconductor chip 100d to the second conductive pad 21 of the second redistribution substrate RD2. As shown in FIG. 8, a width (e.g., in a first direction X parallel to the top surface 1b and/or bottom surface 1a of the substrate 1 of the fourth semiconductor chip 100d) of the second conductive pad 21 of the second redistribution substrate RD2 may be less (e.g., smaller) than a width of the conductive bump 140 of the fourth semiconductor chip 100d (e.g., the width of the second conductive pad 21 may be about 0.8 to 0.9 times the width of the conductive bump 140). The internal connection member 160 may have a structure the same as or similar to that discussed with reference of FIGS. 2A and 2B. An under-fill layer UF may be interposed between the second redistribution substrate RD2 and the fourth semiconductor chip 100d. The under-fill layer UF may contact a sidewall of the third redistribution pattern RP3 and a top surface of the fourth dielectric layer IL4. Other configurations may be identical or similar to those discussed above with reference to FIG. 5.

Figure 9:
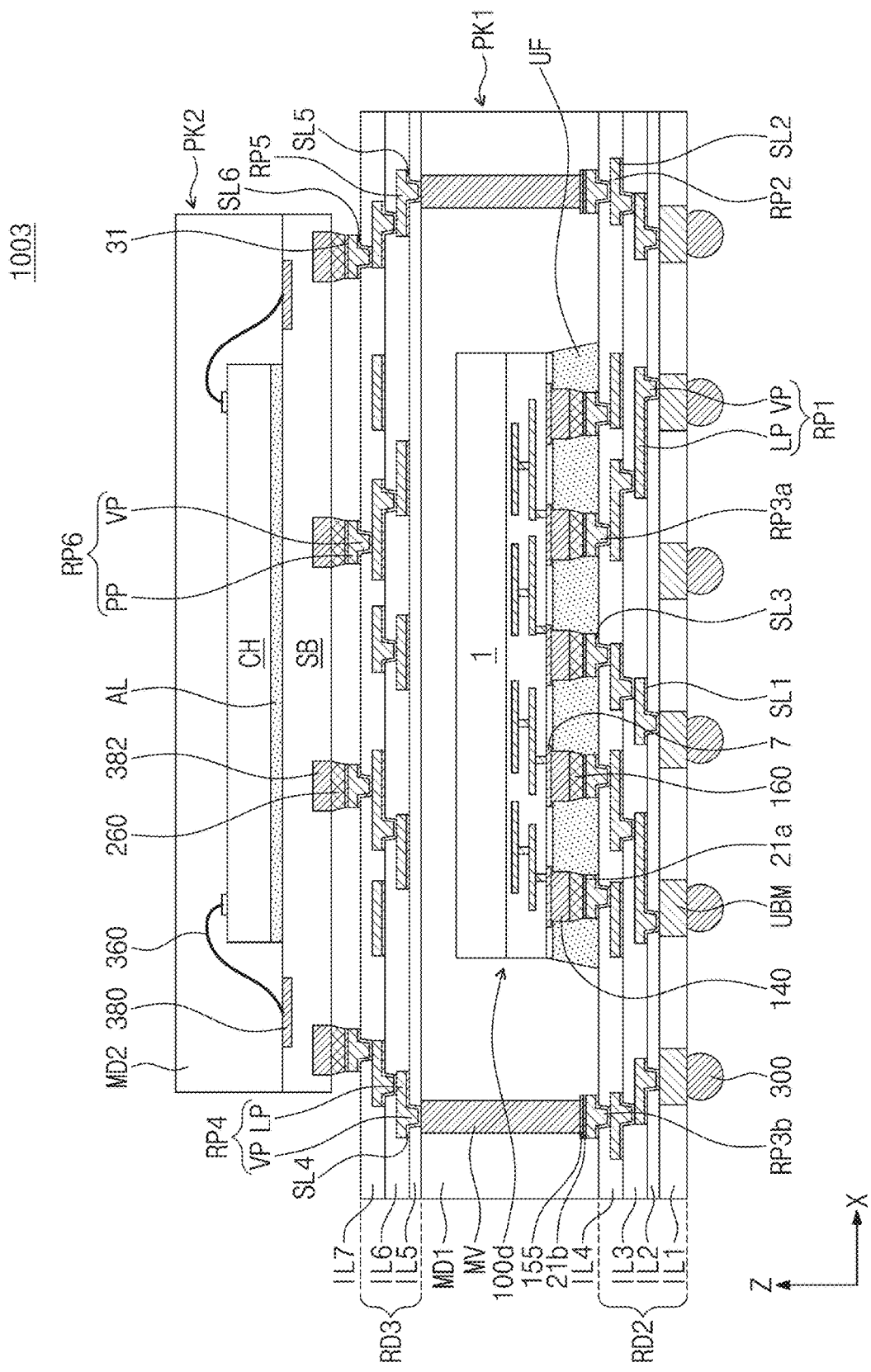
FIG. 9 illustrates a cross-sectional view showing a semiconductor package according to some example embodiments of the present inventive concepts.

FIG. 9 illustrates a cross-sectional view showing a semiconductor package according to some example embodiments of the present inventive concepts.

Referring to FIG. 9, a semiconductor package 1003 according to some example embodiments may include a first sub-semiconductor package PK1 and a second sub-semiconductor package PK2 stacked thereon. The first sub-semiconductor package PK1 may include components of the semiconductor package 1002 of FIG. 8, and may further include a third redistribution substrate RD3 disposed on the structure of the semiconductor package 1002 of FIG. 8 and mold vias MV that connect a second redistribution substrate RD2 to the third redistribution substrate RD3. It will be understood that the third redistribution substrate RD3 is on (e.g., directly or indirectly above) the first mold layer MD1.

For example, the second redistribution substrate RD2 may have a structure the same as or similar to that discussed with reference to FIG. 8. The second redistribution substrate RD2 may include third redistribution patterns RP3a and RP3b, which third redistribution patterns RP3a and RP3b may include third central redistribution patterns RP3a disposed on a center of the second redistribution substrate RD2 and third edge redistribution patterns RP3b disposed on an edge of the second redistribution substrate RD2. Second central conductive pads 21a may be correspondingly disposed on the third central redistribution patterns RP3a. Second edge conductive pads 21b may be correspondingly disposed on the third edge redistribution patterns RP3b. Wetting layers 155 may be correspondingly disposed on the second edge conductive pads 21b.

A fourth semiconductor chip 100d may be mounted on the second redistribution substrate RD2. First internal connection members 160 may connect the second central conductive pads 21a of the second redistribution substrate RD2 to conductive bumps 140 of the fourth semiconductor chip 100d. One or more of the third redistribution patterns RP3a and RP3b may be disposed on a side of the fourth semiconductor chip 100d. The fourth semiconductor chip 100d and the second redistribution substrate RD2 may be covered with a first mold layer MD1. The mold vias MV may penetrate the first mold layer MD1 and may contact corresponding wetting layers 155 on the second edge conductive pads 21b. The mold vias MV may include, for example, copper.

The third redistribution substrate RD3 may include fifth, sixth, and seventh dielectric layers IL5, IL6, and IL7. The fifth, sixth, and seventh redistribution dielectric layers IL5, IL6, and IL7 may each include a photo-imageable dielectric (PID) layer. A fourth redistribution pattern RP4 may be interposed between the fifth dielectric layer IL5 and the sixth dielectric layer IL6. A fourth barrier/seed layer SL4 may be interposed between the fourth redistribution pattern RP4 and the fifth dielectric layer IL5. The fourth redistribution pattern RP4 may be connected to the mold via MV. A fifth redistribution pattern RP5 may be interposed between the sixth dielectric layer IL6 and the seventh dielectric layer IL7. A fifth barrier/seed layer SL5 may be interposed between the fifth redistribution pattern RP5 and the sixth dielectric layer IL6. The fourth redistribution pattern RP4 and the fifth redistribution pattern RP5 may each include a via part VP and a line part LP. For example, the fifth redistribution pattern RP5 may include a via part VP penetrating the sixth dielectric layer IL6 and having a connection with the mold via MV (e.g., via the fourth redistribution pattern RP4) and a line part LP protruding onto the sixth dielectric layer IL6, and the seventh dielectric layer IL7 may cover the sixth dielectric layer IL6 and the fifth redistribution pattern RP5. A sixth redistribution pattern RP6 may be disposed on the seventh dielectric layer IL7. A sixth barrier/seed layer SL6 may be interposed between the sixth redistribution pattern RP6 and the seventh dielectric layer IL7. The sixth redistribution pattern RP6 may have a via part VP and a pad part PP, where the via part VP may penetrate the seventh dielectric layer IL7 and may have a connection with the fifth redistribution pattern RP5 and the pad part PP may protrude onto the seventh dielectric layer IL7. A third conductive pad 31 may be disposed on the pad part PP of the sixth redistribution pattern RP6 and thus may be on (e.g., directly or indirectly above) the sixth redistribution pattern RP6. The fourth to sixth redistribution patterns RP4 to RP6 may each include copper. The third conductive pad 31 may include nickel.

The second sub-semiconductor package PK2 (also referred to herein as an upper semiconductor package) may be on (e.g., may be mounted on) the third redistribution substrate RD3 and may include a package substrate SB, a semiconductor device CH (e.g., second semiconductor device) mounted on (e.g., directly or indirectly above) the package substrate SB (e.g., via an adhesive layer AL), and a second mold layer MD2 that covers the semiconductor device CH and the package substrate SB. The semiconductor device CH may be electrically connected to the package substrate SB through, for example, a wire 360. The semiconductor device CH may be a semiconductor die or chip, or may be a semiconductor package including a plurality of semiconductor dies of the same or different types. The semiconductor device CH may be one selected from an image sensor chip such as CMOS image sensor (CIS), a microelectromechanical system (MEMS) device chip, an application specific integrated circuit (ASIC) chip, and a memory device chip such as a flash memory chip, a dynamic random access memory (DRAM) chip, a static random access memory (SRAM) chip, an electrical erasable programmable read only memory (EEPROM) chip, a phase change random access memory (PRAM) chip, a magnetic random access memory (MRAM) chip, a resistive random access memory (ReRAM) chip, a high bandwidth memory (HBM) chip, and a hybrid memory cubic (HMC) chip.

The second mold layer MD2 may include the same material as that of the first mold layer MD1. The wire 360 may include copper or gold. The package substrate SB may be, for example, a bi-layered or multi-layered printed circuit board. As shown in at least FIG. 9, the package substrate SB may include an upper substrate pad 380 disposed on and/or in a top surface thereof and a lower substrate pad 382 disposed on (e.g., directly or indirectly below) and/or in a bottom surface thereof. As shown in at least FIG. 9, a width of the third conductive pad 31 may be smaller than a width of the lower substrate pad 382. The package substrate SB may have therein an internal line (not shown) that connects the upper substrate pad 380 to the lower substrate pad 382. The upper substrate pad 380 and the lower substrate pad 382 may include one or more of gold, copper, aluminum, and nickel.

The first sub-semiconductor package PK1 may be connected through a second internal connection member 260 to the second sub-semiconductor package PK2. The second internal connection member 260 may connect the lower substrate pad 382 to the third conductive pad 31. The third conductive pad 31 may have a width less (e.g., smaller) than that of the lower substrate pad 382. The pad part PP of the sixth redistribution pattern RP6 may have a width less (e.g., smaller) than that of the lower substrate pad 382. The second internal connection member 260 may have a structure the same as or similar to that of the internal connection member 160 discussed with reference to FIGS. 2A and 2B. Other configurations may be the same as or similar to those discussed with reference to FIG. 8. The mold vias MV may penetrate the first mold layer MD1 and connect the second redistribution substrate RD2 to the third redistribution substrate RD3.

Figure 10:
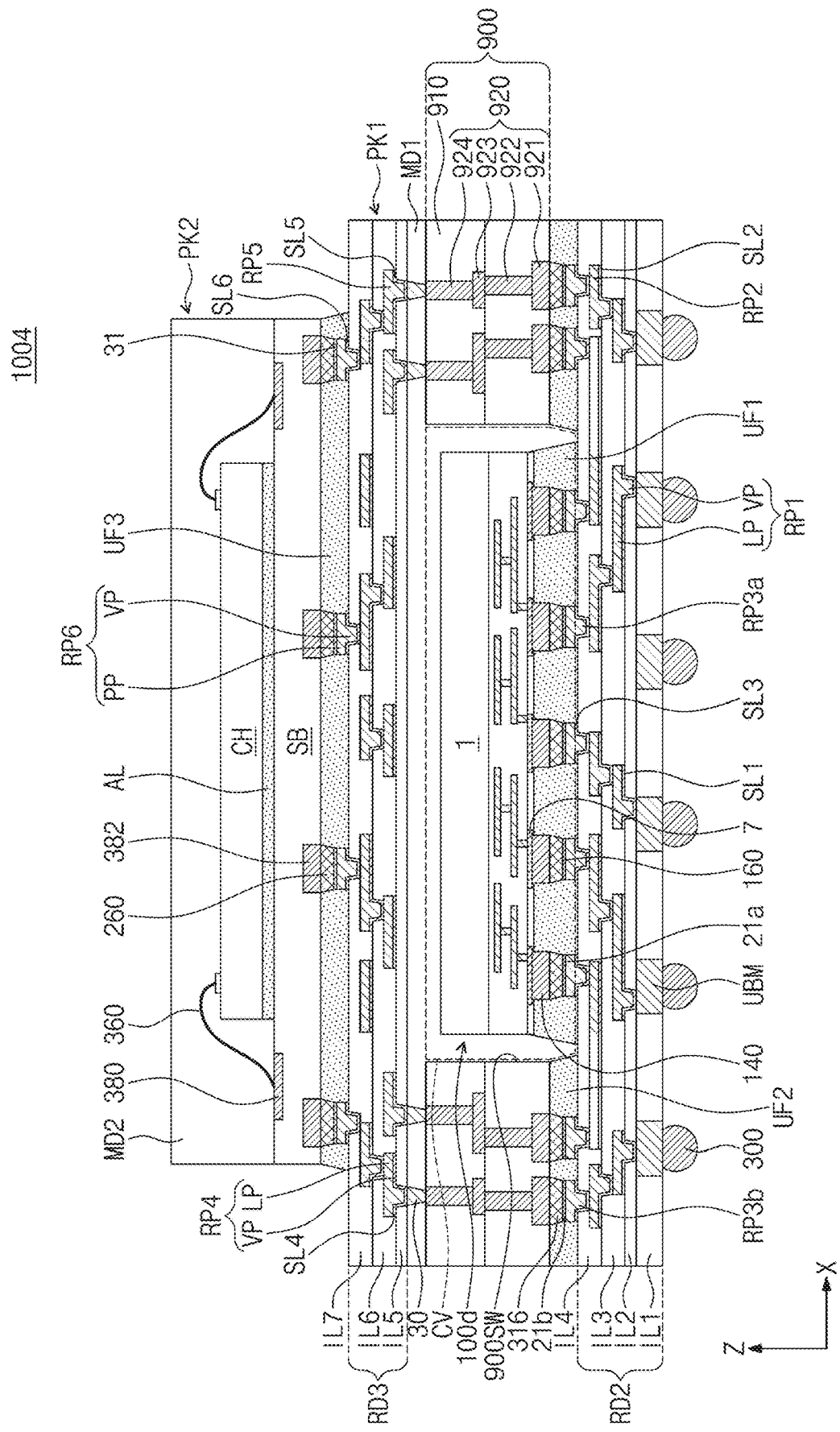
FIG. 10 illustrates a cross-sectional view showing a semiconductor package according to some example embodiments of the present inventive concepts.

FIG. 10 illustrates a cross-sectional view showing a semiconductor package according to some example embodiments of the present inventive concepts.

Referring to FIG. 10, a semiconductor package 1004 according to some example embodiments may be configured such that the first sub-semiconductor package PK1 may include a second redistribution substrate RD2, a connection substrate 900 and a fourth semiconductor chip 100d that are mounted on the second redistribution substrate RD2, a first mold layer MD1 that covers the second redistribution substrate RD2, the connection substrate 900, and the fourth semiconductor chip 100d, and a third redistribution substrate RD3 on the first mold layer MD1. As shown, the connection substrate 900 may be between the second and third redistribution substrates RD2 and RD3 and may be covered with the first mold layer MD1.

A first under-fill layer UF1 may be interposed between the fourth semiconductor chip 100d and the second redistribution substrate RD2. The connection substrate 900 may include a cavity CV at a center thereof. Restated, the connection substrate 900 may include one or more inner sidewalls 900SW that at least partially define the cavity CV. The fourth semiconductor chip 100d may be disposed in (e.g., within) the cavity CV at least partially defined by the one or more inner sidewalls 900SW. The connection substrate 900 may include a plurality of base layers 910 and a conductive structure 920. The base layers 910 may include a dielectric material. For example, the base layers 910 may include a carbon-based material, a ceramic, or a polymer. The conductive structure 920 may include a connection pad 921, a first connection via 922, a connection line 923, and a second connection via 924.

The connection substrate 900 may be connected to the second redistribution substrate RD2 through a third internal connection member 316. The connection pad 921 may have a width greater (e.g., larger) than that of the second edge conductive pad 21b. The third internal connection member 316 may have a structure the same as or similar to that of the internal connection member 160 discussed with reference to FIGS. 2A and 2B. A second under-fill layer UF2 may be interposed between the connection substrate 900 and the second redistribution substrate RD2. The first mold layer MD1 may fill a space between the fourth semiconductor chip 100d and an inner sidewall of the cavity CV of the connection substrate 900. The second under-fill layer UF2 may include the same material as that of the first under-fill layer UF1.

A subsidiary via 30 may penetrate the first mold layer MD1 and may connect the second connection via 924 of the connection substrate 900 to the third redistribution pattern RP3 of the second redistribution substrate RD2. A third under-fill layer UF3 may fill a space between the first sub-semiconductor package PK1 and the second sub-semiconductor package PK2. The third under-fill layer UF3 may include the same material as that of the first under-fill layer UF1. Other configurations may be identical or similar to those discussed above with reference to FIG. 9.

Figure 11:
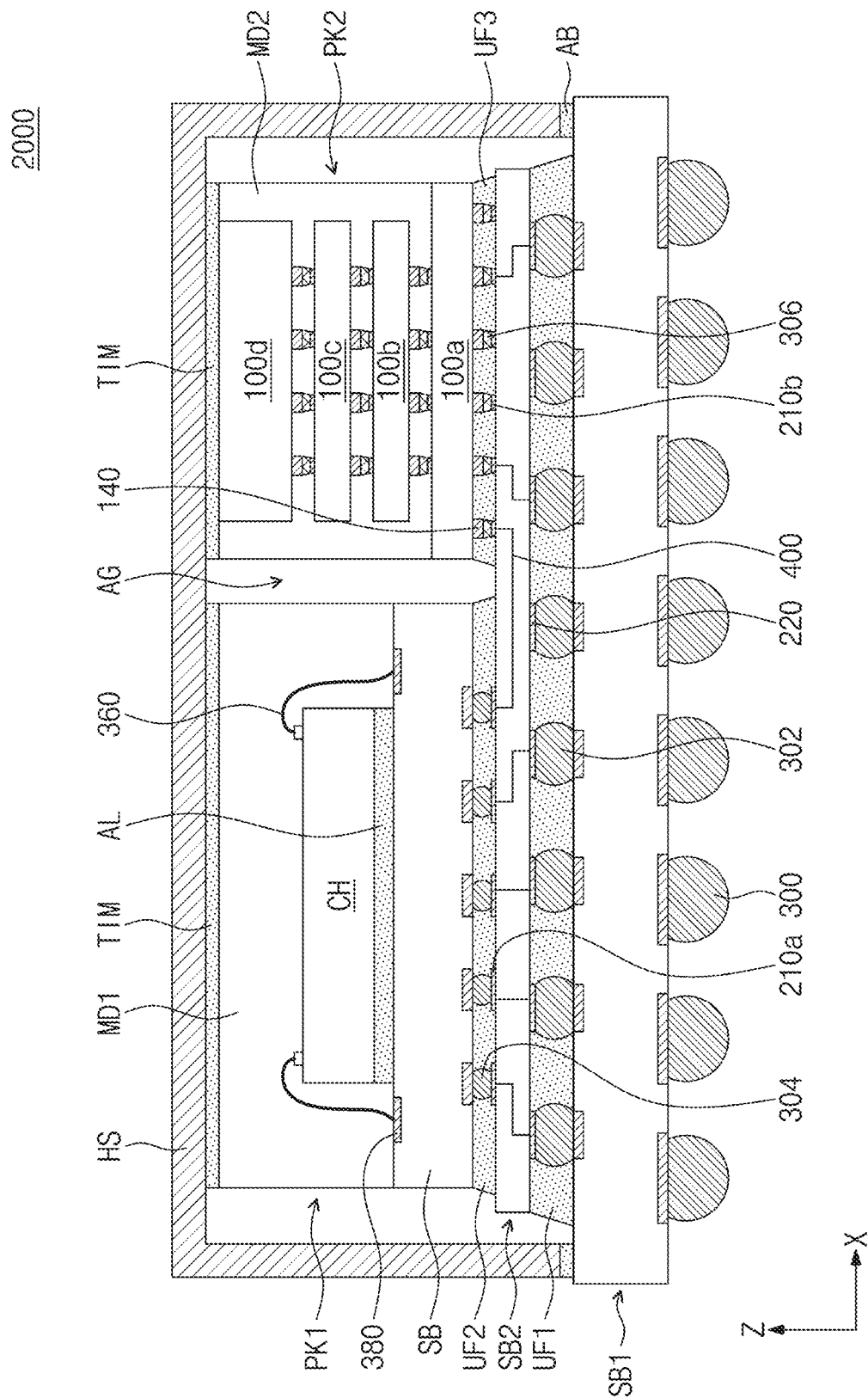
FIG. 11 illustrates a cross-sectional view showing a semiconductor package according to some example embodiments of the present inventive concepts.

FIG. 11 illustrates a cross-sectional view showing a semiconductor package according to some example embodiments of the present inventive concepts.

Referring to FIG. 11, a semiconductor package 2000 according to some example embodiments may be configured such that a second package substrate SB2 may be stacked on a first package substrate SB1. A first sub-semiconductor package PK1 and a second sub-semiconductor package PK2 may be stacked side by side on the second package substrate SB2. The first sub-semiconductor package PK1 and the second sub-semiconductor package PK2 may be spaced apart from each other to provide an air gap AG therebetween. A thermal radiation member HS may cover the first sub-semiconductor package PK1, the second sub-semiconductor package PK2, the first package substrate SB1, and the second package substrate SB2. A thermal interface material layers TIM may be interposed between the thermal radiation member HS and the first sub-semiconductor package PK1 and between the thermal radiation member HS and the second sub-semiconductor package PK2. The thermal interface material layer TIM may not fill the air gap AG. In some example embodiments, a layer AB may be between the thermal radiation member HS and the first package substrate SB1. The layer AB may be an adhesive layer, a thermal interface material layer TIM, or the like. The thermal radiation member HS may include a high thermal conductivity material, such as metal. The thermal interface material layer TIM may include grease or a thermo-curable resin layer. The thermal interface material layer TIM may further include filler particles dispersed in the thermosetting resin layer. The filler particles may include one or more of silica, alumina, zinc oxide, and boron nitride.

The first package substrate SB1 may be, for example, a bi-layered or multi-layered printed circuit board. The printed circuit board may include a core and conductive patterns disposed on opposite surfaces of the core. The core may include a thermosetting resin such as an epoxy resin, a thermoplastic resin such as polyimide, a resin (e.g., prepreg) in which a thermosetting or thermoplastic resin is impregnated with a stiffener such as glass fiber and inorganic filler, or a photo-curable resin, but the present inventive concepts are not limited thereto. External connection terminals 300 may be bonded to a bottom surface of the first package substrate SB1. The external connection terminals 300 may include, for example, one or more of conductive bumps, conductive pillars, and solder balls.

The second package substrate SB2 may be, for example, a silicon-based interposer substrate. The second package substrate SB2 may include first substrate conductive pads 210a and second substrate conductive pads 210b disposed on a top surface thereof, and may also include third substrate conductive pads 220 disposed on a bottom surface thereof. The first package substrate SB1 and the second package substrate SB2 may have therebetween first internal connection members 302 that connect the first and second package substrates SB1 and SB2 to each other. The first internal connection members 302 may correspondingly contact the third substrate conductive pads 220. A first under-fill layer UF1 may be interposed between the first package substrate SB1 and the second package substrate SB2. The first internal connection members 302 may include, for example, one or more of conductive bumps, conductive pillars, and solder balls.

The first sub-semiconductor package PK1 may have a structure the same as or similar to that of the second sub-semiconductor package PK2 discussed with reference to FIG. 9. The first sub-semiconductor package PK1 may be electrically connected through third internal connection members 304 to the first substrate conductive pads 210a of the second package substrate SB2.

The second sub-semiconductor package PK2 may have a structure the same as or similar to that of the semiconductor package 1000 of FIG. 1. Conductive bumps 140 may be disposed on a bottom surface of the second sub-semiconductor package PK2. Fourth internal connection members 306 may connect the conductive bumps 140 of the second sub-semiconductor package PK2 to the second substrate conductive pads 210b of the second package substrate SB2. The fourth internal connection member 306 may have a structure the same as or similar to that of the internal connection member 160 discussed with reference to FIG. 2A. The second substrate conductive pad 210b may have a width less (e.g., smaller) than that of the conductive bump 140 of the second sub-semiconductor package PK2. A third under-fill layer UF3 may be interposed between the second sub-semiconductor package PK2 and the second package substrate SB2. Conductive pads 210a and 220, conductive pads 210a and 210b, and/or conductive pads 210b and 220 may be connected via one or more conductive patterns and/or wiring 400 extending through the second package substrate SB2.

No void or crack may be present in an internal connection member included in a semiconductor package according to the present inventive concepts, and thus the semiconductor package may increase in reliability.

Although the present inventive concepts have been described in connection with some example embodiments of the present inventive concepts illustrated in the accompanying drawings, it will be understood to those skilled in the art that various changes and modifications may be made without departing from the technical spirit and essential feature of the present inventive concepts. It will be apparent to those skilled in the art that various substitution, modifications, and changes may be thereto without departing from the scope and spirit of the present inventive concepts. The embodiments of FIGS. 1 to 11 may be combined with each other.

What is claimed is:

1. A semiconductor package, comprising:
a sequential stack of a first semiconductor chip and a second semiconductor chip; and
a first internal connection member that connects the first semiconductor chip to the second semiconductor chip,
wherein the first semiconductor chip includes
a first substrate that has a first top surface and a first bottom surface that are opposite to each other, and
a first conductive pad on the first top surface, wherein the second semiconductor chip includes
a second substrate that has a second top surface and a second bottom surface that are opposite to each other, and
a conductive bump below the second bottom surface, wherein the first internal connection member connects the first conductive pad of the first semiconductor chip to the conductive bump of the second semiconductor chip,
wherein the first conductive pad has a first width in one direction,
wherein the conductive bump has a second width in the one direction, and
wherein the first width is smaller than the second width.

2. The semiconductor package of claim 1, wherein a magnitude of the first width is about 80% to 90% of a magnitude of the second width.

3. The semiconductor package of claim 1, wherein
the first conductive pad and the conductive bump include a first metal,
the first internal connection member includes the first metal and further includes second, third, and fourth metals,
the first internal connection member includes first, second, third, fourth, and fifth connection regions that are sequentially stacked, each of the first and fifth connection regions includes the first metal and the second metal, and excludes both the third metal and the fourth metal, the third connection region includes the second metal and the third metal, and excludes both the first metal and the fourth metal, and each of the second and fourth connection regions includes the first metal, the second metal, and the fourth metal, and excludes the third metal.

4. The semiconductor package of claim 3, wherein
the first metal includes nickel (Ni),
the second metal includes tin (Sn),
the third metal includes silver (Ag), and
the fourth metal includes gold (Au).

5. The semiconductor package of claim 3, wherein
the first connection region contacts the first conductive pad,
the fifth connection region contacts the conductive bump,
the second connection region has a first average thickness,
the fourth connection region has a second average thickness, and
the first average thickness is greater than the second average thickness.

6. The semiconductor package of claim 1, wherein
the first conductive pad has a first thickness,
the conductive bump has a second thickness, and
the second thickness is greater than the first thickness.

7. The semiconductor package of claim 1, wherein the second semiconductor chip further includes a second conductive pad between the second substrate and the conductive bump, the second conductive pad being in contact with the conductive bump,
wherein the second conductive pad has a third width in the one direction,
wherein the third width is greater than the second width.

8. The semiconductor package of claim 1, wherein
the first semiconductor chip further includes a through via that penetrates the first substrate, the through via being in contact with the first conductive pad,
wherein the through via has a third width in the one direction,
wherein the third width is smaller than the first width.

9. The semiconductor package of claim 1, further comprising:
a first dielectric layer between the first conductive pad and the first substrate; and
a first redistribution pattern that includes a via part and a pad part, the via part penetrating the first dielectric layer, and the pad part protruding onto the first dielectric layer,
wherein the first conductive pad is in contact with the pad part, and
wherein a sidewall of the pad part is aligned with a sidewall of the first conductive pad.

10. The semiconductor package of claim 1, further comprising:
an under-fill layer between the first semiconductor chip and the second semiconductor chip,
wherein the under-fill layer is in simultaneous contact with a sidewall of the first conductive pad, a sidewall of the conductive bump, and a sidewall of the first internal connection member.

11. The semiconductor package of claim 10, wherein the first semiconductor chip further includes:
a plurality of first wiring lines on the first bottom surface;
a first interlayer dielectric layer that covers the first wiring lines;

a first passivation layer that covers the first top surface; and
a first through via that penetrates the first substrate and the first passivation layer,
wherein the first conductive pad contacts the first through via, and
wherein the under-fill layer contacts a top surface of the first passivation layer.

12. A semiconductor package, comprising:
a sequential stack of a first semiconductor chip and a second semiconductor chip; and
a first internal connection member that connects the first semiconductor chip to the second semiconductor chip,
wherein the first semiconductor chip includes
a first substrate that has a first top surface and a first bottom surface that are opposite to each other, and
a first conductive pad on the first top surface, wherein the second semiconductor chip includes
a second substrate that has a second top surface and a second bottom surface that are opposite to each other,
a second conductive pad adjacent to the second bottom surface, and
a conductive bump bonded to and below the second conductive pad,
wherein the first internal connection member connects the first conductive pad to the conductive bump,
wherein the first internal connection member includes:
a first connection region adjacent to the first conductive pad, and
a second connection region adjacent to the conductive bump,
wherein each of the first and second connection regions includes gold (Au),
wherein the first connection region has a first average thickness, and
wherein the second connection region has a second average thickness smaller than the first average thickness.

13. The semiconductor package of claim 12, wherein
the first conductive pad has a first width in one direction,
the conductive bump has a second width in the one direction, and
the first width is smaller than the second width.

14. The semiconductor package of claim 12, wherein the first internal connection member further includes
a third connection region between the first conductive pad and the first connection region;
a fourth connection region between the first connection region and the second connection region; and
a fifth connection region between the fourth connection region and the conductive bump,
wherein all of the first conductive pad, the conductive bump, and the third to fifth connection regions exclude gold,
wherein each of the first conductive pad and the conductive bump includes a first metal,
wherein each of the third and fifth connection regions includes the first metal and a second metal,
wherein the fourth connection region includes the second metal and a third metal, and excludes the first metal, and
wherein each of the first and second connection regions further includes the first metal and the second metal, and excludes the third metal.

15. The semiconductor package of claim 12, wherein a width of the first internal connection member narrows with increased proximity to the first conductive pad.

16. The semiconductor package of claim 12, further comprising:
- a first dielectric layer between the first conductive pad and the first substrate; and
- a first redistribution pattern that includes a via part and a pad part, the via part penetrating the first dielectric layer, and the pad part protruding onto the first dielectric layer,
- wherein the first conductive pad is in contact with the pad part, and
- wherein a sidewall of the pad part is aligned with a sidewall of the first conductive pad.

17. A semiconductor package, comprising:
- a sequential stack of a plurality of semiconductor chips; and
- a mold layer that covers the plurality of semiconductor chips,
- wherein each semiconductor chip of the semiconductor chips includes
    - a semiconductor substrate that has a top surface and a bottom surface,
    - an interlayer dielectric layer that is below and covers the bottom surface of the semiconductor substrate of the semiconductor chip,
    - a first conductive pad below the interlayer dielectric layer of the semiconductor chip,
    - a conductive bump below the first conductive pad of the semiconductor chip and bonded to the first conductive pad of the semiconductor chip,
    - a through via that penetrates the semiconductor substrate of the semiconductor chip and is above the first conductible pad of the semiconductor chip, and
    - a second conductive pad on the top surface of the semiconductor substrate of the semiconductor chip, and above and in contact with the through via of the semiconductor chip, such that the first conductive pad of the semiconductor chip is below the second conductive pad of the semiconductor chip and is above the conductive bump of the semiconductor chip, wherein
        - the second conductive pad has a first width in one direction,
        - the conductive bump has a second width in the one direction,
        - the first conductive pad has a third width,
        - the first width is smaller than the second width, and
        - the third width is greater than the second width, such that the first conductive pad of the semiconductor chip is wider than both the second conductive pad of the semiconductor chip and the conductive bump of the semiconductor chip.

18. The semiconductor package of claim 17, wherein
the plurality of semiconductor chips includes a first semiconductor chip and a second semiconductor chip that immediately overlies the first semiconductor chip,
the semiconductor package further includes a plurality of internal connection members that lie between adjacent semiconductor chips of the plurality of semiconductor chips and collectively connect the plurality of semiconductor chips to each other,
one of the internal connection members connects the second conductive pad of the first semiconductor chip to the conductive bump of the second semiconductor chip,
the one of the internal connection members includes:
- a first connection region adjacent to the second conductive pad of the first semiconductor chip; and
- a second connection region adjacent to the conductive bump of the second semiconductor chip, the first and second connection regions are spaced apart from each other and include gold (Au),
the first connection region is spaced apart from the second conductive pad of the first semiconductor chip, and
the second connection region is spaced apart from the conductive bump of the second semiconductor chip.

19. The semiconductor package of claim 18, wherein
the first connection region has a first average thickness, and
the second connection region has a second average thickness smaller than the first average thickness.

* * * * *